(12) United States Patent
Min et al.

(10) Patent No.: US 12,230,220 B2
(45) Date of Patent: Feb. 18, 2025

(54) DISPLAY DEVICE

(71) Applicant: LG DISPLAY CO., LTD., Seoul (KR)

(72) Inventors: Byungsam Min, Goyang-si (KR); KangIl Kim, Seoul (KR); Dohyung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/209,297

(22) Filed: Jun. 13, 2023

(65) Prior Publication Data

US 2023/0326417 A1 Oct. 12, 2023

Related U.S. Application Data

(63) Continuation of application No. 17/466,459, filed on Sep. 3, 2021, now Pat. No. 11,715,427.

(30) Foreign Application Priority Data

Sep. 3, 2020 (KR) .......................... 10-2020-0112630
Aug. 18, 2021 (KR) .......................... 10-2021-0108967

(51) Int. Cl.
*G09G 3/3291* (2016.01)
*G09G 3/3266* (2016.01)
(Continued)

(52) U.S. Cl.
CPC ......... *G09G 3/3291* (2013.01); *G09G 3/3266* (2013.01); *H10K 59/1213* (2023.02);
(Continued)

(58) Field of Classification Search
CPC .. G09G 3/3291; G09G 3/3266; H10K 59/353; H10K 59/131; H10K 59/1213
See application file for complete search history.

(56) References Cited

U.S. PATENT DOCUMENTS 9,343,022 B2 * 5/2016 Park ..................... G09G 3/2003
9,523,901 B2 * 12/2016 Li ......................... G02F 1/1368
(Continued)

FOREIGN PATENT DOCUMENTS

CN           105405416 A      3/2016
KR    10-2011-0014016 A      2/2011
(Continued)

OTHER PUBLICATIONS

Taiwanese First Office Action and Search Report dated Jul. 18, 2022 issued in corresponding Patent Application No. 110132894 w/English Translation (7 pages).
(Continued)

*Primary Examiner* — Sardis F Azongha
(74) *Attorney, Agent, or Firm* — Birch, Stewart, Kolasch & Birch, LLP

(57) ABSTRACT

A display device includes each of the plurality of data lines divided into a plurality of sub data lines, and each of the plurality of sub data lines connected to a plurality of sub pixels having the same color, the first reference voltage line connected to the plurality of first sub pixels disposed in the 8k-7th column, the plurality of second sub pixels disposed in the 8k-6th column, the plurality of third sub pixels disposed in the 8k-5th column, the plurality of fourth sub pixels disposed in the 8k-4th column, and the second reference voltage line is connected to the plurality of first sub pixels disposed in the 8k-3rd column, the plurality of second sub pixels disposed in the 8k-2nd column, the plurality of third sub pixels disposed in the 8k-1st column, the plurality of fourth sub pixels disposed in the 8k-th column.

14 Claims, 13 Drawing Sheets

(51) Int. Cl.
  *H10K 59/121* (2023.01)
  *H10K 59/131* (2023.01)
  *H10K 59/35* (2023.01)
(52) U.S. Cl.
  CPC ....... *H10K 59/1216* (2023.02); *H10K 59/131* (2023.02); *H10K 59/353* (2023.02); *G09G 2300/0452* (2013.01); *G09G 2310/0272* (2013.01)

(56) References Cited

U.S. PATENT DOCUMENTS

| | | | |
|---|---|---|---|
| 10,115,351 | B2 | 10/2018 | Kim |
| 10,269,277 | B2 | 4/2019 | Shim |
| 2014/0149135 | A1 | 5/2014 | Boerger et al. |
| 2014/0198135 | A1 | 7/2014 | Eom et al. |
| 2018/0083078 | A1* | 3/2018 | Park .................. H10K 59/1213 |
| 2020/0074926 | A1 | 3/2020 | Lin et al. |

FOREIGN PATENT DOCUMENTS

| | | |
|---|---|---|
| KR | 10-2016-0108710 A | 9/2016 |
| KR | 10-2018-0036135 A | 4/2018 |
| TW | 201822179 A | 6/2018 |
| TW | 202008339 A | 2/2020 |

OTHER PUBLICATIONS

Chinese Office Action dated Oct. 17, 2023 issued in Patent Application No. 202111031229.8 w/English Translation (30 pages).
Chinese Notice of Allowance issued on Apr. 18, 2024 issued in Patent Application No. 202111031229.8 w/English Translation (10 pages).

* cited by examiner

DISPLAY DEVICE

CROSS-REFERENCE TO RELATED APPLICATIONS

This application is a continuation of U.S. patent application Ser. No. 17/466,459, filed on Sep. 3, 2021, which claims the priority of Korean Patent Application No. 10-2020-0112630 filed on Sep. 3, 2020, and Korean Patent Application No. 10-2021-0108967, filed on Aug. 18, 2021, which are hereby incorporated by reference in their entity for all purposes as if fully set forth herein.

BACKGROUND

Field of the Disclosure

The present disclosure relates to a display device, and more particularly, to a display device which is capable of sensing a light emitting diode.

Description of the Background

As display devices which are used for a monitor of a computer, a television, or a cellular phone, there are an organic light emitting display device (OLED) which is a self-emitting device and a liquid crystal display device (LCD) which requires a separate light source.

Among various display devices, an organic light emitting display device includes a display panel including a plurality of sub pixels and a driver which drives the display panel. The driver includes a gate driver configured to supply a gate signal to the display panel and a data driver configured to supply a data voltage. When a signal such as a gate signal and a data voltage is supplied to a sub pixel of the organic light emitting display device, the selected sub pixel emits light to display images.

Further, the degree of the change in the characteristic values between circuit elements of a sub pixel may vary depending on a difference in the degree of degradation of each circuit element. Such a difference in the changing degree of the characteristic values between the circuit elements may cause a luminance deviation between the sub pixels. That is, the luminance deviation between the sub pixels may cause problems such as degradation of the accuracy of the luminance expressiveness of the sub pixel or screen abnormality.

SUMMARY

Accordingly, the present disclosure is to provide a display device including a sensing transistor which senses a characteristic value of a sub pixel.

The present disclosure is also to provide a display device which improves a sensing speed.

The present disclosure is not limited to the above-mentioned features, which are not mentioned above, can be clearly understood by those skilled in the art from the following descriptions.

According to an aspect of the present disclosure, a display device includes a display panel in which a plurality of pixels including a plurality of first sub pixels, a plurality of second sub pixels, a plurality of third sub pixels, and a plurality of fourth sub pixels each having a different color is disposed; a data driver configured to supply a data voltage to the plurality of pixels by means of a plurality of data lines using a sensing result of the plurality of pixels by a first reference voltage line and a second reference voltage line; and a gate driver configured to supply a gate signal to the plurality of pixels by means of a plurality of gate lines, the plurality of first sub pixels is disposed in a 8 k-7th column and a 8 k-3rd column, the plurality of second sub pixels is disposed in a 8 k-6th column and a 8 k-2nd column, the plurality of third sub pixels is disposed in a 8 k-5th column and a 8 k-1st column, and the plurality of fourth sub pixels is disposed in a 8 k-4th column and a 8 k-th column, each of the plurality of data lines is divided into a plurality of sub data lines, and each of the plurality of sub data lines is connected to a plurality of sub pixels having the same color, the first reference voltage line is connected to the plurality of first sub pixels disposed in the 8 k-7th column, the plurality of second sub pixels disposed in the 8 k-6th column, the plurality of third sub pixels disposed in the 8 k-5th column, and the plurality of fourth sub pixels disposed in the 8 k-4th column, and the second reference voltage line is connected to the plurality of first sub pixels disposed in the 8 k-3rd column, the plurality of second sub pixels disposed in the 8 k-2nd column, the plurality of third sub pixels disposed in the 8 k-1st column, and the plurality of fourth sub pixels disposed in the 8 k-th column, thereby reducing a sensing time of the plurality of sub pixels.

According to another aspect of the present disclosure, a display device includes: a display panel in which a plurality of pixels including a plurality of first sub pixels, a plurality of second sub pixels, a plurality of third sub pixels, and a plurality of fourth sub pixels each having a different color is disposed; a data driver configured to supply a data voltage to the plurality of pixels by means of a plurality of data lines using a sensing result of the plurality of pixels by a first reference voltage line, a second reference voltage line, and a third reference voltage line; and a gate driver configured to supply a gate signal to the plurality of pixels by means of a plurality of gate lines, the plurality of first sub pixels is disposed in a 8 k-7th column and a 8 k-3rd column, the plurality of second sub pixels is disposed in a 8 k-6th column and a 8 k-2nd column, the plurality of third sub pixels is disposed in a 8 k-5th column and a 8 k-1st column, and the plurality of fourth sub pixels is disposed in a 8 k-4th column and a 8 k-th column, each of the plurality of data lines is divided into a plurality of sub data lines, and each of the plurality of sub data lines is connected to a plurality of sub pixels having the same color, the first reference voltage line is connected to a plurality of first sub pixels disposed in a 8 k-7th column and a plurality of second sub pixels disposed in a 8 k-6th column, the second reference voltage line is connected to a plurality of third sub pixels disposed in a 8 k-5th column, a plurality of fourth sub pixels disposed in a 8 k-4th column, a plurality of first sub pixels disposed in a 8 k-3rd column, and a plurality of second sub pixels disposed in a 8 k-2nd column, and the third reference voltage line is connected to a plurality of third sub pixels disposed in a 8 k-1st column and a plurality of fourth sub pixels disposed in a 8 k-th column, thereby more precisely sensing the plurality of sub pixels.

Other detailed matters of the exemplary aspects are included in the detailed description and the drawings.

According to the present disclosure, a sub pixel with a different color is sensed during one scan timing to compensate for a data voltage more precisely.

According to the present disclosure, a plurality of sub pixels is sensed during one scan timing to sense all sub pixels more quickly.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
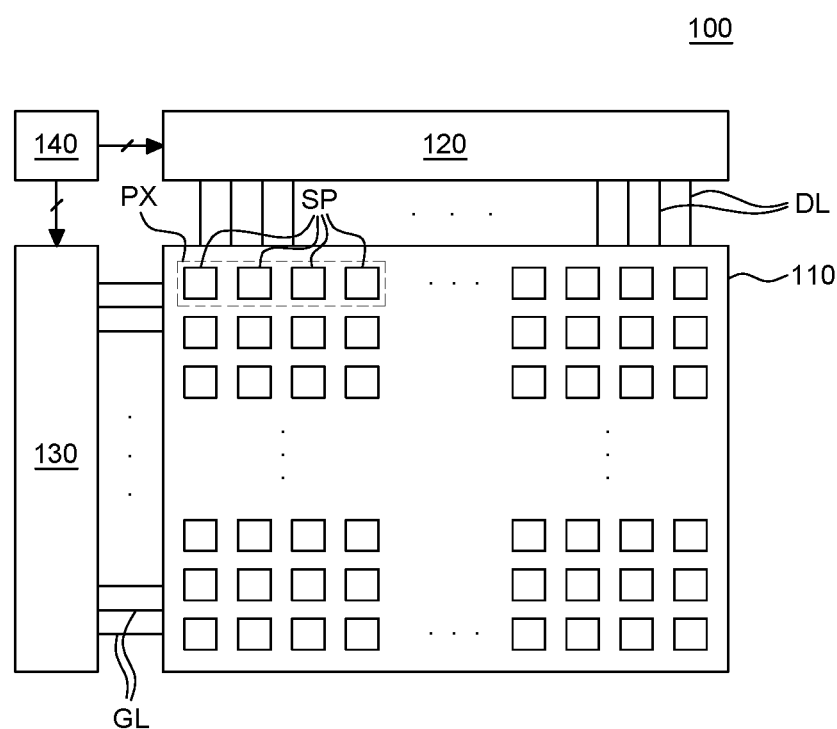
FIG. 1 is a schematic view of a display device according to an exemplary aspect of the present disclosure.

The advantages and features of the present disclosure, and methods for accomplishing the same will be more clearly understood from exemplary aspects described below with reference to the accompanying drawings. However, the present disclosure is not limited to the following exemplary aspects but may be implemented in various different forms. The exemplary aspects are provided only to complete disclosure of the present disclosure and to fully provide a person with ordinary skill in the art to which the present disclosure pertains with the category of the present disclosure, and the present disclosure will be defined by the appended claims.

The shapes, dimensions, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the dimensions and thickness of each component illustrated in the drawings are represented for convenience in explanation, the present disclosure is not necessarily limited to the illustrated dimensions and thickness of each component.

The features of various aspects of the present disclosure can be partially or entirely coupled to or combined with each other and can be interlocked and operated in technically various ways, and the aspects can be carried out independently of or in association with each other.

A transistor used for a display device of the present disclosure may be implemented by one or more transistors among n-channel transistors (NMOS) and p-channel transistors (PMOS).

The transistor may be implemented by an oxide semiconductor transistor having an oxide semiconductor as an active layer or an LTPS transistor having a low temperature polysilicon (LTPS) as an active layer. The transistor may include at least a gate electrode, a source electrode, and a drain electrode. The transistor may be implemented by a thin film transistor on a display panel (TFT). In the transistor, carriers flow from the source electrode to the drain electrode. In the case of the n-channel transistor (NMOS), since the carriers are electrons, in order to allow the electrons to flow from the source electrode to the drain electrode, a source voltage is lower than a drain voltage. A direction of the current in the n-channel transistor (NMOS) flows from the drain electrode to the source electrode and the source electrode may serve as an output terminal. In the case of the p-channel transistor (PMOS), since the carriers are holes, in order to allow the holes to flow from the source electrode to the drain electrode, a source voltage is higher than a drain voltage. In the p-channel transistor (PMOS), the holes flow from the source electrode to the drain electrode so that current flows from the source to the drain and the drain electrode may serve as an output terminal. Accordingly, the source and the drain may be changed in accordance with the applied voltage so that it should be noted that the source and the drain of the transistor are not fixed. In the present specification, it is assumed that the transistor is an n-channel transistor (NMOS), but is not limited thereto so that the p-channel transistor may be used and thus a circuit configuration may be changed.

A gate signal of transistors which are used as switching elements swings between a gate-on voltage and a gate-off voltage. The gate-on voltage is set to be higher than a threshold voltage Vth of the transistor, and the gate-off voltage is set to be lower than the threshold voltage Vth of the transistor. The transistor is turned on in response to the gate-on voltage and is turned off in response to the gate-off voltage. In the case of the NMOS, the gate-on voltage may be a gate high voltage VGH and the gate-off voltage is a gate low voltage VGL. In the case of the PMOS, the gate-on voltage is a gate low voltage VGL and the gate-off voltage may be a gate high voltage VGH.

Hereinafter, various exemplary aspects of the present disclosure will be described in detail with reference to accompanying drawings.

FIG. 1 is a schematic view of a display device according to an exemplary aspect of the present disclosure. Referring to FIG. 1, a display device 100 includes a display panel 110, a gate driver 120, a data driver 130, and a timing controller 140.

The display panel 110 is a panel for displaying images. The display panel 110 may include various circuits, wiring lines, and light emitting diodes disposed on the substrate. The display panel 110 is divided by a plurality of data lines DL and a plurality of gate lines GL intersecting each other and may include a plurality of pixels PX connected to the plurality of data lines DL and the plurality of gate lines GL. The display panel 110 may include a display area defined by a plurality of pixels PX and a non-display area in which various signal lines, pads, or the like are formed. The display panel 110 may be implemented by a display panel 110 used in various display devices such as a liquid crystal display device, an organic light emitting display device, or an electrophoretic display device. Hereinafter, it is described that the display panel 110 is a panel used in the organic light emitting display device, but is not limited thereto.

The timing controller 140 receives timing signals such as a vertical synchronization signal, a horizontal synchronization signal, a data enable signal, or a dot clock by means of a receiving circuit such as an LVDS or TMDS interface connected to a host system. The timing controller 140 generates timing control signals based on the input timing signal to control the data driver 130 and the gate driver 120.

The data driver 130 supplies a data voltage DATA to the plurality of sub pixels SP. The data driver 130 may include a plurality of source drive ICs (integrated circuits). The plurality of source drive ICs may be supplied with digital video data and a source timing control signal from the timing controller 140. The plurality of source drive ICs converts digital video data into a gamma voltage in response to the source timing control signal to generate a data voltage DATA and supply the data voltage DATA through the data line DL of the display panel 110. The plurality of source drive ICs may be connected to the data line DL of the display panel 110 by a chip on glass (COG) process or a tape automated bonding (TAB) process. Further, the source drive ICs are formed on the display panel 110 or are formed on a separate PCB substrate to be connected to the display panel 110.

The gate driver 120 supplies a gate signal to the plurality of sub pixels SP. The gate driver 120 may include a level shifter and a shift register. The level shifter shifts a level of a clock signal input at a transistor-transistor-logic (TTL) level from the timing controller 140 and then may supply the clock signal to the shift register. The shift register may be formed in the non-display area of the display panel 110, by a GIP manner, but is not limited thereto. The shift register may be configured by a plurality of stages which shifts the gate signal to output, in response to the clock signal and the driving signal. The plurality of stages included in the shift register sequentially may output the gate signal through a plurality of output ends.

The display panel 110 may include a plurality of sub pixels SP. The plurality of sub pixels SP may be sub pixels for emitting different color light. For example, the plurality of sub pixels SP may be a red sub pixel, a green sub pixel, a blue sub pixel, and a white sub pixel, but is not limited thereto. The plurality of sub pixels SP may configure a pixel PX. That is, the red sub pixel, the green sub pixel, the blue sub pixel, and the white sub pixel may configure one pixel PX and the display panel 110 may include a plurality of pixels PX.

Hereinafter, a driving circuit for driving one sub pixel SP will be described in more detail with reference to FIG. 2 together.

Figure 2:
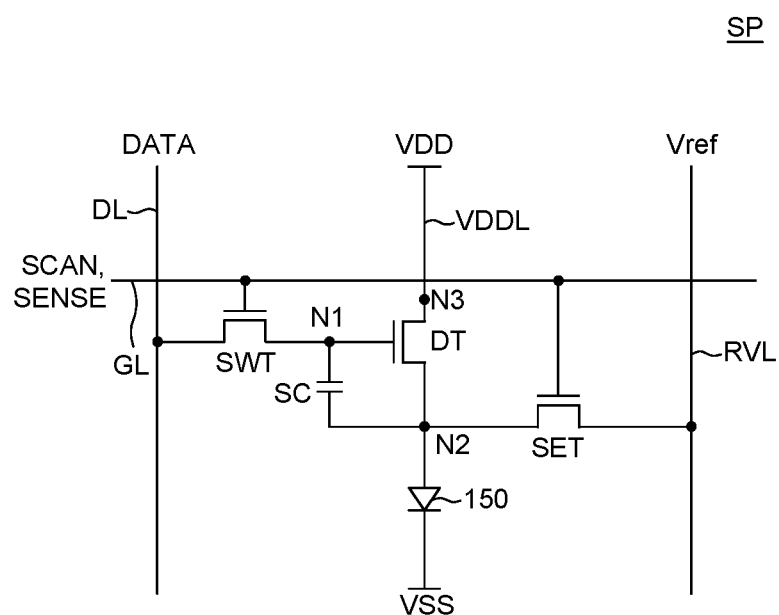
FIG. 2 is a circuit diagram of a sub pixel of a display device according to an exemplary aspect of the present disclosure.

FIG. 2 is a circuit diagram of a sub pixel of a display device according to an exemplary aspect of the present disclosure. In FIG. 2, a circuit diagram for one sub pixel SP among the plurality of sub pixels SP of the display device 100 is illustrated.

Referring to FIG. 2, the sub pixel SP may include a switching transistor SWT, a sensing transistor SET, a driving transistor DT, a storage capacitor SC, and a light emitting diode 150.

The light emitting diode 150 may include an anode, an organic layer, and a cathode. The organic layer may include various organic layers such as a hole injection layer, a hole transport layer, an organic light emitting layer, an electron transport layer, and an electron injection layer. The anode of the light emitting diode 150 may be connected to an output terminal of the driving transistor DT and a low potential voltage VSS may be applied to the cathode. Even though in FIG. 2, it is described that the light emitting diode 150 is an organic light emitting diode 150, the present disclosure is not limited thereto so that as the light emitting diode 150, an inorganic light emitting diode, that is, an LED may also be used.

Referring to FIG. 2, the switching transistor SWT is a transistor which transmits the data voltage DATA to a first node N1 corresponding to a gate electrode of the driving transistor DT. The switching transistor SWT may include a drain electrode connected to the data line DL, a gate electrode connected to the gate line GL, and a source electrode connected to the gate electrode of the driving transistor DT. The switching transistor SWT is turned on by a scan signal SCAN applied from the gate line GL to transmit a data voltage DATA supplied from the data line DL to the first node N1 corresponding to the gate electrode of the driving transistor DT.

Referring to FIG. 2, the driving transistor DT is a transistor configured to supply a driving current to the light emitting diode 150 to drive the light emitting diode 150. The driving transistor DT may include a gate electrode corresponding to the first node N1, a source electrode corresponding to a second node N2 and an output terminal, and a drain electrode corresponding to a third node N3 and an input terminal. The gate electrode of the driving transistor DT is connected to the switching transistor SWT, the drain electrode is applied with a high potential voltage VDD by means of a high potential voltage line VDDL, and the source electrode may be connected to the anode of the light emitting diode 150.

Referring to FIG. 2, a storage capacitor SC is a capacitor which maintains a voltage corresponding to the data voltage DATA for one frame. One electrode of the storage capacitor SC is connected to the first node N1 and the other electrode may be connected to the second node N2.

In the meantime, in the case of the display device 100, as the driving time of each sub pixel SP is increased, the circuit element such as the driving transistor DT may be degraded. Accordingly, a unique characteristic value of the circuit element such as a driving transistor DT may be changed. Here, the unique characteristic value of the circuit element may include a threshold voltage Vth of the driving transistor DT, a mobility a of the driving transistor DT, or the like. The change in the characteristic value of the circuit element may cause a luminance change of the corresponding sub pixel SP. Accordingly, the change in the characteristic value of the circuit element may be used as the same concept as the luminance change of the sub pixel SP.

Further, the degree of the change in the characteristic values between circuit elements of each sub pixel SP may vary depending on a difference in the degree of degradation of each circuit element. Such a difference in the changed degree of the characteristic values between the circuit elements may cause a luminance deviation between the sub pixels SP. Accordingly, the characteristic value deviation between circuit elements may be used as the same concept as the luminance deviation between the sub pixels SP. The change in the characteristic values of the circuit elements, that is, the luminance change of the sub pixel SP and the characteristic value deviation between the circuit elements, that is, the luminance deviation between the sub pixels SP may cause problems such as the lowering of the accuracy for luminance expressiveness of the sub pixel SP or screen abnormality.

Therefore, the sub pixel SP of the display device 100 according to the exemplary aspect of the present disclosure may provide a sensing function of sensing a characteristic value for the sub pixel SP and a compensating function of compensating for the characteristic value of the sub pixel SP using the sensing result.

Therefore, as illustrated in FIG. 2, the sub pixel SP may further include a sensing transistor SET to effectively control a voltage state of the source electrode of the driving transistor DT, in addition to the switching transistor SWT, the driving transistor DT, the storage capacitor SC, and the light emitting diode 150.

Referring to FIG. 2, the sensing transistor SET is connected between the source electrode of the driving transistor DT and the reference voltage line RVL configured to supply a reference voltage Vref and a gate electrode is connected to the gate line GL. Therefore, the sensing transistor SET is turned on by the sensing signal SENSE applied through the gate line GL to apply the reference voltage Vref which is supplied through the reference voltage line RVL to the source electrode of the driving transistor DT. Further, the sensing transistor SET may be utilized as one of voltage sensing paths for the source electrode of the driving transistor DT.

Referring to FIG. 2, the switching transistor SWT and the sensing transistor SET of the sub pixel SP may share one gate line GL. That is, the switching transistor SWT and the sensing transistor SET are connected to the same gate line GL to be applied with the same gate signal. However, for the convenience of description, a voltage which is applied to the gate electrode of the switching transistor SWT is referred to as a scan signal SCAN and a voltage which is applied to the gate electrode of the sensing transistor SET is referred to as a sensing signal SENSE. However, the scan signal SCAN and the sensing signal SENSE applied to one sub pixel SP are the same signal which is transmitted from the same gate line GL. Therefore, in FIG. 3, the scan signal SCAN and the sensing signal SENSE are defined as gate signals GATE1, GATE2, GATE3, and GATE4.

However, the present disclosure is not limited thereto so that only the switching transistor SWT is connected to the gate line GL and the sensing transistor SET may be connected to a separate sensing line. Therefore, the scan signal SCAN may be applied to the switching transistor SWT through the gate line GL and the sensing signal SENSE may be applied to the sensing transistor SET through the sensing line.

Accordingly, the reference voltage Vref is applied to the source electrode of the driving transistor DT by means of the sensing transistor SET. Further, a voltage for sensing the threshold voltage Vth of the driving transistor DT or the mobility a of the driving transistor DT is detected by the reference voltage line RVL. Further, the data driver 130 may compensate for the data voltage DATA in accordance with a variation of the threshold voltage Vth of the driving transistor DT or the mobility a of the driving transistor DT.

Hereinafter, a placement relationship of the plurality of sub pixels will be described with reference to FIG. 3.

Figure 3:
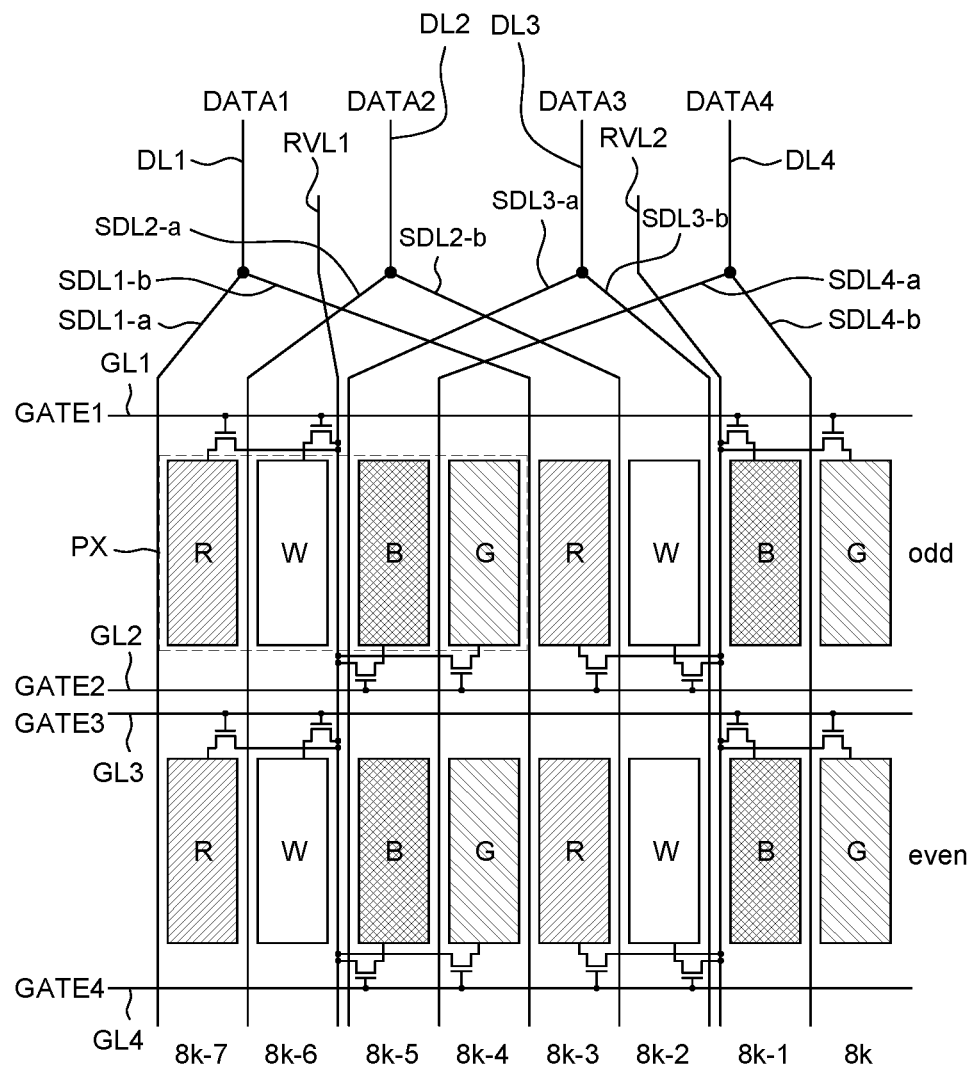
FIG. 3 is a block diagram for explaining a placement relationship of sub pixels of a display device according to an exemplary aspect of the present disclosure.

FIG. 3 is a block diagram for explaining a placement relationship of sub pixels of a display device according to an exemplary aspect of the present disclosure.

In FIG. 3, for the convenience of description, only four pixels PX which are disposed in a 2×2 matrix are illustrated and in the display area, the placement relationship of four pixels PX disposed in a 2×2 matrix is repeated. Further, the transistor disposed between the sub pixels R, G, B, and W and the gate line refers to the sensing transistor SET described with reference to FIG. 2.

Referring to FIG. 3, one pixel PX includes four sub pixels R, G, B, and W. For example, as illustrated in FIG. 3, the pixel PX may include a first sub pixel R, a second sub pixel W, a third sub pixel B, and a fourth sub pixel G. Further, the first sub pixel R may be a red sub pixel, the second sub pixel W may be a white sub pixel, the third sub pixel B may be a blue sub pixel, and the fourth sub pixel G may be a green sub pixel. However, the present disclosure is not limited thereto and the plurality of sub pixels may be changed to various colors such as magenta, yellow, and cyan.

Further, the plurality of same color sub pixels R, G, B, and W may be disposed in the same column. That is, a plurality of first sub pixels R is disposed in the same column, a plurality of second sub pixels W is disposed in the same column, a plurality of third sub pixels B is disposed in the same column, and a plurality of fourth sub pixels G is disposed in the same column.

To be more specific, as illustrated in FIG. 3, the plurality of first sub pixels R is disposed in a 8 k-7th column and a 8 k-3rd column and the plurality of second sub pixels W is disposed in a 8 k-6th column and a 8 k-2nd column. Further, the plurality of third sub pixels B is disposed in a 8 k-5th column and a 8 k-1st column and the plurality of fourth sub pixels G is disposed in a 8 k-4th column and a 8 k-th column. Here, k refers to a natural number of 1 or larger.

That is, the first sub pixels R, the second sub pixels W, third sub pixels B, and the fourth sub pixels G are sequentially repeated with respect to one odd-numbered row or one even-numbered row.

Further, a plurality of data lines DL1, DL2, DL3, and DL4 may be divided into a plurality of sub data lines SDL1-a, SDL1-b, SDL2-a, SDL2-b, SDL3-a, SDL3-b, SDL4-a, and SDL4-b, respectively. Specifically, the first data line DL1 may be divided into a plurality of first sub data lines SDL1-a and SDL1-b, and the second data line DL2 may be divided into a plurality of second sub data lines SDL2-a and SDL2-b. Further, the third data line DL3 may be divided into a plurality of third sub data lines SDL3-a and SDL3-b, and the fourth data line DL4 may be divided into a plurality of fourth sub data lines SDL4-a and SDL4-b.

Further, the first sub data lines SDL1-a and SDL1-b may include a 1-a-th sub data line SDL1-a and a 1-b-th sub data line SDL1-b, and the second sub data lines SDL2-a and SDL2-b may include a 2-a-th sub data line SDL2-a and a 2-b-th sub data line SDL2-b. Further, the third sub data lines SDL3-a and SDL3-b may include a 3-a-th sub data line SDL3-a and a 3-b-th sub data line SDL3-b, and the fourth sub data lines SDL4-a and SDL4-b may include a 4-a-th sub data line SDL4-a and a 4-b-th sub data line SDL4-b.

Further, the plurality of first sub data lines SDL1-a and SDL1-b is disposed to be adjacent to the plurality of first sub pixels R to be connected to the plurality of first sub pixels R.

Specifically, the 1-a-th sub data line SDL1-a is disposed at one side of a plurality of first sub pixels R disposed in the 8 k-7th column to be electrically connected to the plurality of first sub pixels R disposed in the 8 k-7th column. Further, a plurality of 1-b-th sub data lines SDL1-b is disposed between a plurality of first sub pixels R disposed in the 8 k-3rd column and a plurality of fourth sub pixels G disposed in the 8 k-4th column to be electrically connected to the plurality of first sub pixels R disposed in the 8 k-3rd column.

Further, the plurality of second sub data lines SDL2-a and SDL2-b is disposed to be adjacent to the plurality of second sub pixels W to be connected to the plurality of second sub pixels W.

Specifically, a 2-a-th sub data line SDL2-a is disposed between a plurality of first sub pixels R disposed in the 8 k-7th column and the plurality of second sub pixels W disposed in the 8 k-6th column to be electrically connected to the plurality of second sub pixels W disposed in the 8 k-6th column. Specifically, the other one of the plurality of 2-b-th sub data lines SDL2-b is disposed between the plurality of first sub pixels R disposed in the 8 k-3rd column and the plurality of second sub pixels W disposed in the 8 k-2nd column to be electrically connected to the plurality of second sub pixels W disposed in the 8 k-2nd column.

Further, the plurality of third sub data lines SDL3-a and SDL3-b is disposed to be adjacent to the plurality of third sub pixels B to be connected to the plurality of third sub pixels B.

Specifically, the 3-a-th sub data line SDL3-a is disposed between the plurality of third sub pixels B disposed in the 8 k-5th column and the plurality of second sub pixels W disposed in the 8 k-6th column to be electrically connected to the plurality of third sub pixels B disposed in the 8 k-5th column. Further, the 3-b-th sub data line SDL3-b is disposed between the plurality of third sub pixels B disposed in the 8 k-1st column and the plurality of second sub pixels W disposed in the 8 k-2nd column to be electrically connected to the plurality of third sub pixels B disposed in the 8 k-1st column.

Further, the plurality of fourth sub data lines SDL4-a and SDL4-b is disposed to be adjacent to the plurality of fourth sub pixels G to be connected to the plurality of fourth sub pixels G.

Specifically, the 4-a-th sub data line SDL4-a is disposed between the plurality of third sub pixels B disposed in the 8 k-5th column and the plurality of fourth sub pixels G disposed in the 8 k-4th column to be electrically connected to the plurality of fourth sub pixels G disposed in the 8 k-4th column. Specifically, the other one of the plurality of 4-b-th sub data lines SDL4-b is disposed between the plurality of third sub pixels B disposed in the 8 k-1st column and the plurality of fourth sub pixels G disposed in the 8 k-th column to be electrically connected to the plurality of fourth sub pixels G disposed in the 8 k-th column.

Further, a first data voltage DATA1 which is a red data voltage may be applied to the first data line DL1, and a second data voltage DATA2 which is a white data voltage may be applied to the second data line DL2. Further, a third data voltage DATA3 which is a blue data voltage may be applied to the third data line DL3, and a fourth data voltage DATA4 which is a green data voltage may be applied to the fourth data line DL4.

Therefore, the first data voltage DATA1 which is a red data voltage may be applied to the plurality of first sub data lines SDL1-a and SDL1-b, and the second data voltage DATA2 which is a white data voltage may be applied to the plurality of second sub data line SDL2-a and SDL2-b. Further, the third data voltage DATA3 which is a blue data voltage may be applied to the plurality of third sub data lines SDL3-a and SDL3-b, and the fourth data voltage DATA4 which is a green data voltage may be applied to the plurality of fourth sub data lines SDL4-a and SDL4-b.

Each of the plurality of gate lines GL1 to GL4 may be disposed on both sides of the plurality of sub pixels R, G, B, and W, and two gate lines GL2 and GL3 may be disposed between the plurality of sub pixels R, G, B, and W.

Specifically, referring to FIG. 3, the first gate line GL1 and the second gate line GL2 are disposed on both sides of the plurality of sub pixels R, G, B, and W in odd-numbered rows, and the third gate line GL3 and the fourth gate line GL4 may be disposed on both sides of the plurality of sub pixels R, G, B, and W in even-numbered rows. Therefore, the second gate line GL2 and the third gate line GL3 may be disposed between the plurality of sub pixels R, G, B, and W in the odd-numbered rows and the plurality of sub pixels R, G, B, and W in the even-numbered rows.

In the meantime, in one pixel PX, the first sub pixel R and the second sub pixel W are connected to the same gate lines GL1 to GL4 and in one pixel PX, the third sub pixel B and the fourth sub pixel G may be connected to the same gate lines GL1 to GL4.

Further, sub pixels R, W, B, and G having the same color which are adjacent to each other in one row may be connected to different gate lines GL1 to GL4. That is, in one row, adjacent first sub pixels R are connected to different gate lines GL1 to GL4, adjacent second sub pixels W is connected to different gate lines GL1 to GL4, adjacent third sub pixels B are connected to different gate lines GL1 to GL4, and adjacent fourth sub pixels G is connected to different gate lines GL1 to GL4.

In other words, the plurality of first sub pixels R disposed in the 8 k-7th column, the plurality of second sub pixels W disposed in the 8 k-6th column, the plurality of third sub pixels B disposed in the 8 k-1st column, and the plurality of fourth sub pixels G disposed in the 8 k-th column are connected to odd-numbered gate lines GL1 and GL3. Further, the plurality of third sub pixels B disposed in the 8 k-5th column, the plurality of fourth sub pixels G disposed in the 8 k-4th column, the plurality of first sub pixels R disposed in the 8 k-3rd column, and the plurality of second sub pixels W disposed in the 8 k-2nd column are connected to even-numbered gate lines GL2 and GL4.

For example, as illustrated in FIG. 3, in the odd-numbered rows, the plurality of first sub pixels R disposed in the 8 k-7th column is connected to the first gate line GL1 and the plurality of first sub pixels R disposed in the 8 k-3rd column adjacent thereto is connected to the second gate line GL2. Further, in the odd-numbered rows, the plurality of second sub pixels W disposed in the 8 k-6th column is connected to the first gate line GL1 and the plurality of second sub pixels W disposed in the 8 k-2nd column adjacent thereto is connected to the second gate line GL2. Further, in the odd-numbered rows, the plurality of third sub pixels B disposed in the 8 k-5th column is connected to the second gate line GL2 and the plurality of third sub pixels B disposed in the 8 k-1st column adjacent thereto is connected to the first gate line GL1. Further, in the odd-numbered rows, the plurality of fourth sub pixels G disposed in the 8 k-4th column is connected to the second gate line GL2 and the plurality of fourth sub pixels G disposed in the 8 k-th column adjacent thereto is connected to the first gate line GL1.

Further, as illustrated in FIG. 3, in the even-numbered rows, the plurality of first sub pixels R disposed in the 8 k-7th column is connected to the third gate line GL3 and the plurality of first sub pixels R disposed in the 8 k-3rd column adjacent thereto is connected to the fourth gate line GL4. Further, in the even-numbered rows, the plurality of second sub pixels W disposed in the 8 k-6th column is connected to the third gate line GL3 and the plurality of second sub pixels W disposed in the 8 k-2nd column adjacent thereto is connected to the fourth gate line GL4. Further, in the even-numbered rows, the plurality of third sub pixels B disposed in the 8 k-5th column is connected to the fourth gate line GL4 and the plurality of third sub pixels B disposed in the 8 k-1st column adjacent thereto is connected to the third gate line GL3. Further, in the even-numbered rows, the plurality of fourth sub pixels G disposed in the 8 k-4th column is connected to the fourth gate line GL4 and the plurality of fourth sub pixels G disposed in the 8 k-th column adjacent thereto is connected to the third gate line GL3.

Further, each of the plurality of reference voltage lines RVL1 and RVL2 may be disposed in one pixel PX.

Specifically, a first reference voltage line RVL1 is disposed between the plurality of second sub pixels W disposed in the 8 k-6th column and the plurality of third sub pixels B disposed in the 8 k-5th column. Therefore, the plurality of first sub pixels R disposed in the 8 k-7th column, the plurality of second sub pixels W disposed in the 8 k-6th column, the plurality of third sub pixels B disposed in the 8 k-5th column, and the plurality of fourth sub pixels G disposed in the 8 k-4th column may be connected to the first reference voltage line RVL1.

Further, a second reference voltage line RVL2 is disposed between the plurality of second sub pixels W disposed in the 8 k-2nd column and the plurality of third sub pixels B disposed in the 8 k-1st column. Therefore, the plurality of first sub pixels R disposed in the 8 k-3rd column, the plurality of second sub pixels W disposed in the 8 k-2nd column, the plurality of third sub pixels B disposed in the 8 k-1st column, and the plurality of fourth sub pixels G disposed in the 8 k-th column may be connected to the second reference voltage line RVL2.

Hereinafter, a sensing method of a display device 100 according to an exemplary aspect of the present disclosure will be described in detail with reference to FIG. 4.

Figure 4:
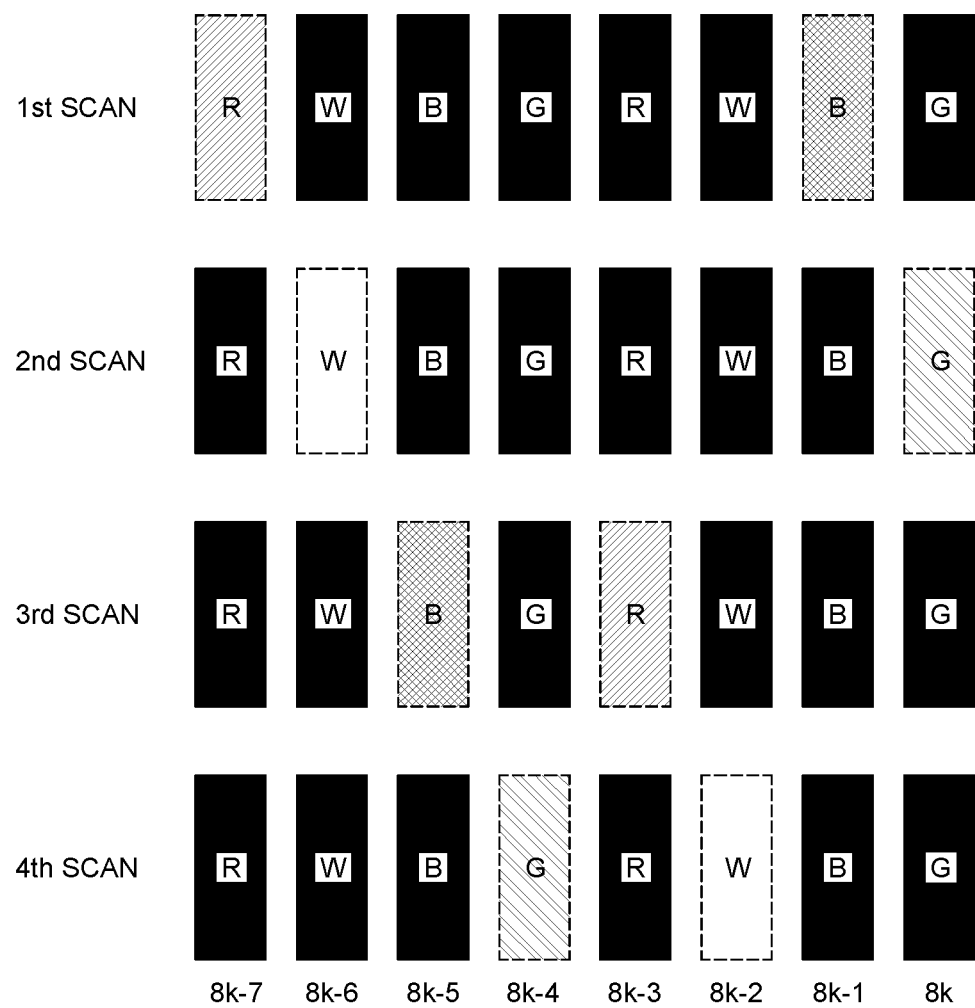
FIG. 4 is a view for explaining a sensing method of a display device according to one exemplary aspect of the present disclosure.

FIG. 4 is a view for explaining a sensing method of a display device according to one exemplary aspect of the present disclosure.

In FIG. 4, in the odd-numbered rows illustrated in FIG. 3, a sensing order for each of a plurality of sub pixels R, G, B, and W disposed in the 8 k-7th column to 8 k-th column is illustrated. However, in the even-numbered rows, the sensing order for each of the plurality of sub pixels R, G, B, and W disposed in the 8 k-7th column to 8 k-th column may be the same as the sensing order for each of the plurality of sub pixels R, G, B, and W disposed in the 8 k-7th column to 8 k-th column in the odd-numbered rows. However, the present disclosure is not limited thereto and the sensing order for each of the plurality of sub pixels R, G, B and W may vary in various ways. Further, the plurality of sub pixels R, G, B, W disposed in the even-numbered rows and the plurality of sub pixels R, G, B, W disposed in the odd-numbered rows may be sensed in different time periods. However, the present disclosure is not limited thereto and the plurality of sub pixels R, G, B, W disposed in the even-numbered rows and the plurality of sub pixels R, G, B, W disposed in the odd-numbered rows may be sensed in the same time period.

In FIG. 4, during a first scan period 1st SCAN and a second scan period 2nd SCAN in which a gate high voltage is applied to any one of odd-numbered gate lines GL1 and a third scan period 3rd SCAN and a fourth scan period 4th SCAN in which a gate high voltage is applied to any one of even-numbered gate lines GL2, states of a plurality of sub pixels disposed in one row are illustrated. Further, the first scan period 1st SCAN, the second scan period 2nd SCAN, the third scan period 3rd SCAN, and the fourth scan period 4th SCAN refer to time periods which are sequentially connected.

Further, sub pixels R, G, B, and W represented with dotted lines refer to sub pixels R, G, B, and W in which a data voltage is applied in the corresponding scan period and the sensing is performed. The sub pixels R, G, B, and W with a black pattern refer to sub pixels R, G, B, and W in which a data voltage is not applied in the corresponding scan period and the sensing is not performed.

Referring to FIGS. 3 and 4, during the first scan period 1st SCAN and the second scan period 2nd SCAN, one odd-numbered gate voltages GATE1 is gate high voltage. Therefore, the switching transistor SWT and the sensing transistor SET are turned on in the plurality of first sub pixels R disposed in the 8 k-7th column, the plurality of second sub pixels W disposed in the 8 k-6th column, the plurality of third sub pixels B disposed in the 8 k-1st column, and the plurality of fourth sub pixels G disposed in the 8 k-th column, connected to the any one of odd-numbered gate lines GL1.

Further, during the first scan period 1st SCAN, the data voltage is applied to only any one of the plurality of first sub pixels R disposed in the 8 k-7th column and the plurality of second sub pixels W disposed in the 8 k-6th column, connected to the any one of odd-numbered gate lines GL1, so that the sensing is performed by the first reference voltage line RVL1. Further, the data voltage is applied to only any one of the plurality of third sub pixels B disposed in the 8 k-1st column and the plurality of fourth sub pixels G disposed in the 8 k-th column, connected to the any one of odd-numbered gate lines GL1, so that the sensing is performed by the second reference voltage line RVL2.

Next, during the second scan period 2nd SCAN, the data voltage is applied to only the other one of the plurality of first sub pixels R disposed in the 8 k-7th column and the plurality of second sub pixels W disposed in the 8 k-6th column, connected to the any one of odd-numbered gate lines GL1, so that the sensing is performed by the first reference voltage line RVL1. Further, the data voltage is applied to only the other one of the plurality of third sub pixels B disposed in the 8 k-1st column and the plurality of fourth sub pixels G disposed in the 8 k-th column, connected to the any one of odd-numbered gate lines GL1, so that the sensing is performed by the second reference voltage line RVL2.

For example, as illustrated in FIGS. 3 and 4, during the first scan period 1st SCAN, the data voltage is applied to the plurality of first sub pixels R disposed in the 8 k-7th column to perform the sensing by the first reference voltage line RVL1. Further, the data voltage is applied to the plurality of third sub pixels B disposed in the 8 k-1st column to perform the sensing by the second reference voltage line RVL2.

Next, during the second scan period 2nd SCAN, the data voltage is applied to the plurality of second sub pixels W disposed in the 8 k-6th column to perform the sensing by the first reference voltage line RVL1. Further, the data voltage is applied to the plurality of fourth sub pixels G disposed in the 8 k-th column to perform the sensing by the second reference voltage line RVL2.

Further, during the third scan period 3rd SCAN and the fourth scan period 4th SCAN, one even-numbered gate voltages GATE2 is gate high voltage. Therefore, the switching transistor SWT and the sensing transistor SET are turned on in the plurality of third sub pixels B disposed in the 8 k-5th column, the plurality of fourth sub pixels G disposed in the 8 k-4th column, the plurality of first sub pixels R disposed in the 8 k-3rd column, and the plurality of second sub pixels W disposed in the 8 k-2nd column, connected to the any one of even-numbered gate lines GL2.

Further, during the third scan period 3rd SCAN, the data voltage is applied to only any one of the plurality of third sub pixels B disposed in the 8 k-5th column, the plurality of fourth sub pixels G disposed in the 8 k-4th column, connected to the any one of even-numbered gate lines GL2. Therefore, the sensing is performed by the first reference voltage line RVL1. Further, the data voltage is applied to only any one of the plurality of first sub pixels R disposed in the 8 k-3rd column, and the plurality of second sub pixels W disposed in the 8 k-2nd column, connected to the any one of even-numbered gate lines GL2. Therefore, the sensing is performed by the second reference voltage line RVL2.

Next, in the fourth scan period 4th SCAN, the data voltage is applied to only the other one of the plurality of third sub pixels B disposed in the 8 k-5th column, the plurality of fourth sub pixels G disposed in the 8 k-4th column, connected to the any one of even-numbered gate lines GL2, so that the sensing is performed by the first reference voltage line RVL1. Further, the data voltage is applied to only the other one of the plurality of first sub pixels R disposed in the 8 k-3rd column, and the plurality of second sub pixels W disposed in the 8 k-2nd column, connected to the any one of even-numbered gate lines GL2, so that the sensing is performed by the second reference voltage line RVL2.

For example, as illustrated in FIGS. 3 and 4, during the third scan period 3rd SCAN, the data voltage is applied to the plurality of third sub pixels B disposed in the 8 k-5th column to perform the sensing by the first reference voltage line RVL1. Further, the data voltage is applied to the plurality of first sub pixels R disposed in the 8 k-3rd column to perform the sensing by the second reference voltage line RVL2.

Next, during the fourth scan period 4th SCAN, the data voltage is applied to the plurality of fourth sub pixels G disposed in the 8 k-4th column to perform the sensing by the first reference voltage line RVL1. Further, the data voltage is applied to the plurality of second sub pixels W disposed in the 8 k-2nd column to perform the sensing by the second reference voltage line RVL2.

As described above, in one scan period among a plurality of scan periods, sub pixels R, G, B, and W having different colors may be sensed.

In the case of the display device of the related art, when the sub pixels having the same color are sensed in one scan period among a plurality of scan periods, it is not sure which of a sensing value measured by the first reference voltage line and a sensing value measured by the second reference voltage line is used to determine the compensation of the data voltage for one color.

Therefore, the display device 100 according to the exemplary aspect of the present disclosure senses the sub pixels R, G, B, and W having different colors in one scan period among the plurality of scan periods to provide a clear compensation criteria of a data voltage for each color. Accordingly, the display device 100 according to the exemplary aspect of the present disclosure may more accurately compensate for the data voltage DATA.

Further, in the display device of the related art, in one scan period, only one sub pixel among a plurality of sub pixels disposed in a 8 k-7th column to a 8 k-th column is sensed so that eight scan periods are necessary to sense all the plurality of sub pixels disposed in the 8 k-7th column to 8 k-th column.

In contrast, in the display device 100 according to the exemplary aspect of the present disclosure, in one scan period, two sub pixels among a plurality of sub pixels R, G, B, and W disposed in a 8 k-7th column to a 8 k-th column are sensed. Therefore, only four scan periods are necessary to sense all the plurality of sub pixels R, G, B, and W disposed in a 8 k-7th column to a 8 k-th column. Accordingly, the display device 100 according to the exemplary aspect of the present disclosure may more quickly sense the plurality of sub pixels.

Figure 5:
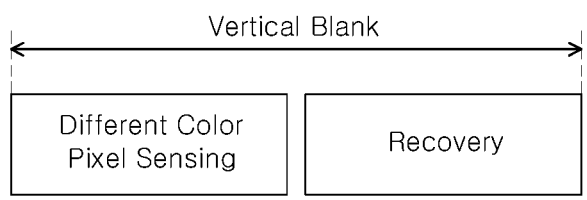
FIG. 5 is a view for explaining a sensing period of a display device according to one exemplary aspect of the present disclosure.

FIG. 5 is a view for explaining a sensing period of a display device according to one exemplary aspect of the present disclosure.

The display device according to one exemplary aspect of the present disclosure may sense the plurality of sub pixels R, G, B, W in various periods.

The display device according to one exemplary aspect of the present disclosure may sense the plurality of sub pixels R, G, B, W before displaying images (Power On-Real time sensing). Alternatively, the display device according to one exemplary aspect of the present disclosure may sense the plurality of sub pixels R, G, B, W when a power is turned off(Power Off-Real time sensing). Alternatively, the display device according to one exemplary aspect of the present disclosure may sense the plurality of sub pixels R, G, B, W while displaying images(V-RT sensing; Vertical blank period Real Time sensing).

The above-mentioned V-RT sensing will be described with reference to FIG. 5. The display device according to one exemplary aspect of the present disclosure senses a plurality of sub pixels R, G, B, W with different colors (different color pixel sensing) in a vertical blank period in one frame. Next, after sensing the plurality of sub pixels R, G, B, W in the vertical blank period, in order to display the original image, existing data voltage may be recovered.

For example, in the vertical blank period (vertical blank) in one frame, as illustrated in the first scan period 1st SCAN of FIG. 4, the data voltage is applied to the plurality of first sub pixels R disposed in the 8 k-7th column to be sensed by the first reference voltage line RVL1. Further, the data voltage is applied to the plurality of third sub pixels B disposed in the 8 k-1st column to be sensed by the second reference voltage line RVL2. Thereafter, the existing data voltage is recovered in the plurality of first sub pixels R disposed in the 8 k-7th column to display the original image and the existing data voltage may be recovered also in the plurality of third sub pixels B disposed in the 8 k-1st column to display the original image.

Therefore, the display device according to one exemplary aspect of the present disclosure may sense the plurality of sub pixels while displaying the image so that the plurality of sub pixels is sensed without ensuring a separate sensing period to improve the image quality.

Hereinafter, a display device 200 according to another exemplary aspect of the present disclosure will be described in detail with reference to FIGS. 6 and 7. A difference between the display device 200 according to another exemplary aspect of the present disclosure and the display device 100 according to one exemplary aspect of the present disclosure is a connection relationship of a sub pixel and a reference voltage line. Accordingly, the connection relationship of the sub pixel and the reference voltage line of the display device 200 according to another exemplary aspect of the present disclosure will be described in detail below. Therefore, a repeated description of the display device 200 according to another exemplary aspect of the present disclosure and the display device according to one exemplary aspect of the present disclosure will be omitted.

Figure 6:
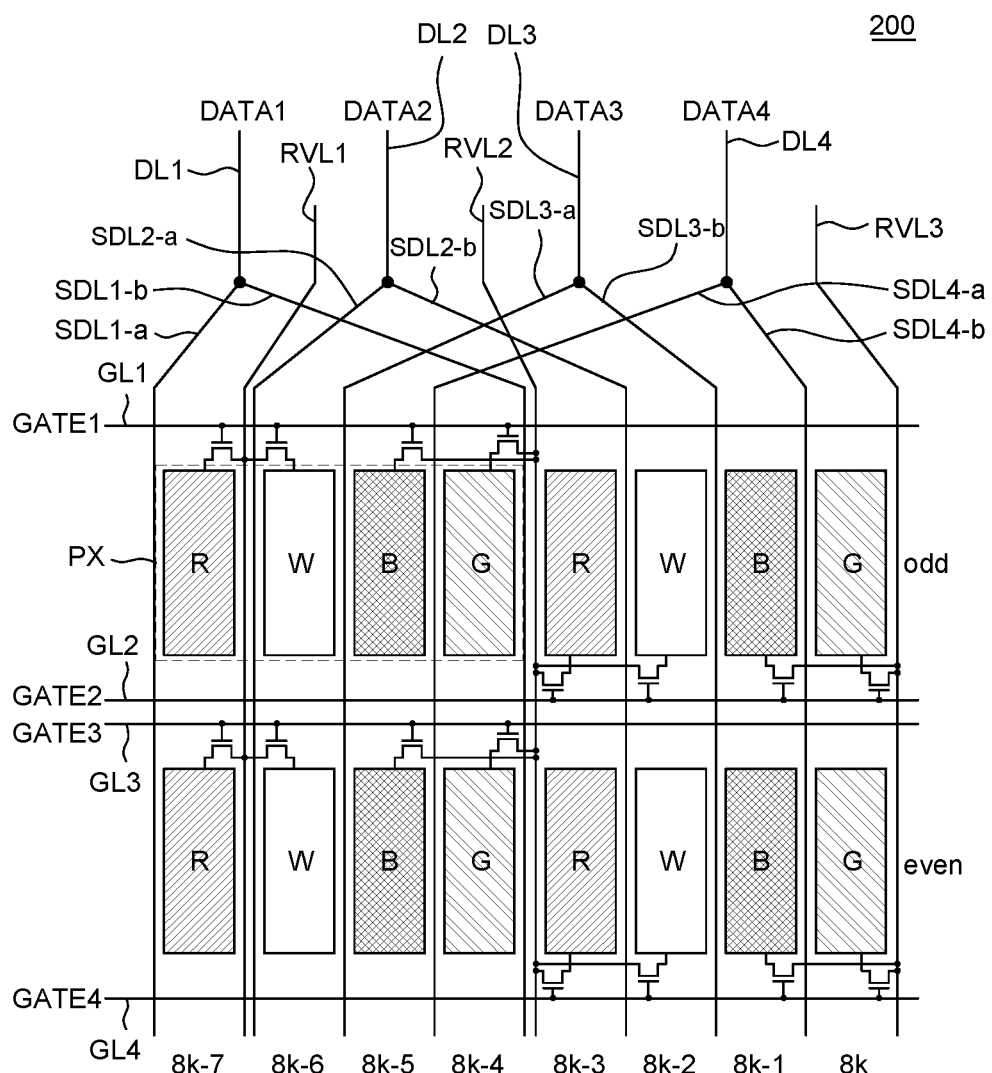
FIG. 6 is a block diagram for explaining a placement relationship of sub pixels of a display device according to another exemplary aspect of the present disclosure.

FIG. 6 is a block diagram for explaining a placement relationship of sub pixels of a display device according to another exemplary aspect of the present disclosure.

Each of the plurality of gate lines GL1 to GL4 may be disposed on both sides of the plurality of sub pixels R, G, B, and W and two gate lines GL2 and GL3 may be disposed between the plurality of sub pixels R, G, B, and W.

Specifically, referring to FIG. 6, the first gate line GL1 and the second gate line GL2 are disposed on both sides of the plurality of sub pixels R, G, B, and W in the odd-numbered rows, and the third gate line GL3 and the fourth gate line GL4 may be disposed on both sides of the plurality of sub pixels R, G, B, and W in the even-numbered rows. Therefore, the second gate line GL2 and the third gate line GL3 may be disposed between the plurality of sub pixels R, G, B, and W in the odd-numbered rows and the plurality of sub pixels R, G, B, and W in the even-numbered rows.

In the meantime, each of the plurality of pixels PX is connected to the same gate line GL1 to GL4 and adjacent pixels PX among the plurality of pixels PX may be connected to different gate lines GL1 to GL4.

In other words, a plurality of first sub pixels R disposed in a 8 k-7th column, a plurality of second sub pixels W disposed in a 8 k-6th column, a plurality of third sub pixels B disposed in a 8 k-5th column, and a plurality of fourth sub pixels G disposed in a 8 k-4th column are connected to odd-numbered gate lines GL1 and GL3. Further, a plurality of first sub pixels R disposed in a 8 k-3rd column, a plurality of second sub pixels W disposed in a 8 k-2nd column, a plurality of third sub pixels B disposed in a 8 k-1st column, and a plurality of fourth sub pixels G disposed in a 8 k-th column are connected to even-numbered gate lines GL2 and GL4.

Specifically, referring to FIG. 6, the sub pixels R, W, B, and G included in pixels PX disposed in the 8 k-7th column to 8 k-4th column of the odd-numbered rows are connected to the first gate line GL1. Further, the sub pixels R, W, B, and G included in pixels PX disposed in the 8 k-3rd column to 8 k-th column of the odd-numbered rows are connected to the second gate line GL2. Further, the sub pixels R, W, B, and G included in pixels PX disposed in the 8 k-7th column to 8 k-4th column of the even-numbered rows are connected to the third gate line GL3. Further, the sub pixels R, W, B, and G included in pixels PX disposed in the 8 k-3rd column to 8 k-th column of the even-numbered rows are connected to the fourth gate line GL4.

Further, the first reference voltage line RVL1 is disposed in one pixel PX, but the second reference voltage line RVL2 and the third reference voltage line RVL3 may be disposed between pixels PX.

Specifically, the first reference voltage line RVL1 is disposed between the plurality of first sub pixels R disposed in the 8 k-7th column and the plurality of second sub pixels W disposed in the 8 k-6th column. Therefore, the plurality of first sub pixels R disposed in the 8 k-7th column and the plurality of second sub pixels W disposed in the 8 k-6th column may be connected to the first reference voltage line RVL1.

Further, the second reference voltage line RVL2 is disposed between the plurality of fourth sub pixels G disposed in the 8 k-4th column and the plurality of first sub pixels R disposed in the 8 k-3rd column. Therefore, the plurality of third sub pixels B disposed in the 8 k-5th column, the plurality of fourth sub pixels G disposed in the 8 k-4th column, the plurality of first sub pixels R disposed in the 8 k-3rd column, and the plurality of second sub pixels W disposed in the 8 k-2nd column may be connected to the second reference voltage line RVL2.

Further, the third reference voltage line RVL3 is disposed to be adjacent to the plurality of fourth sub pixels G disposed in the 8 k-th column so that the plurality of third sub pixels B disposed in the 8 k-1st column and the plurality of fourth sub pixels G disposed in the 8 k-th column may be connected to the third reference voltage line RVL3.

Even though not illustrated in FIG. 6, the third reference voltage line RVL3 may also be connected to the plurality of first sub pixels R and the plurality of second sub pixels W which are disposed to be adjacent. Hereinafter, a sensing method of a display device 200 according to another exemplary aspect of the present disclosure will be described in detail with reference to FIG. 7.

Figure 7:
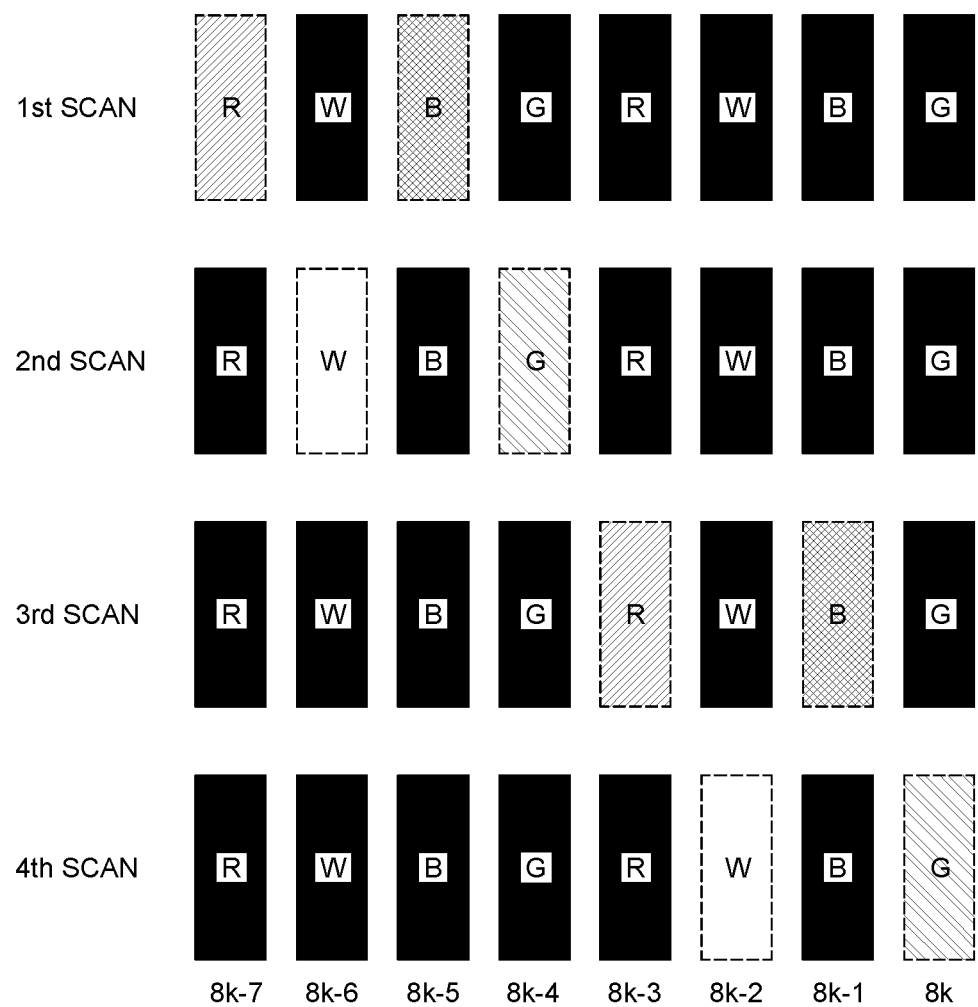
FIG. 7 is a view for explaining a sensing method of a display device according to another exemplary aspect of the present disclosure.

FIG. 7 is a view for explaining a sensing method of a display device according to another exemplary aspect of the present disclosure.

In FIG. 7, in the odd-numbered rows illustrated in FIG. 6, a sensing order for each of a plurality of sub pixels R, G, B, and W disposed in the 8 k-7th column to 8 k-th column is illustrated. However, in the even-numbered rows, the sensing order for each of the plurality of sub pixels R, G, B, and W disposed in the 8 k-7th column to 8 k-th column may be the same as the sensing order for each of the plurality of sub pixels R, G, B, and W disposed in the 8 k-7th column to 8 k-th column in the odd-numbered rows. However, the present disclosure is not limited thereto and the sensing order for each of the plurality of sub pixels R, G, B and W may vary in various ways. Further, the plurality of sub pixels R, G, B, W disposed in the even-numbered rows and the plurality of sub pixels R, G, B, W disposed in the odd-numbered rows may be sensed in different time periods. However, the present disclosure is not limited thereto and the plurality of sub pixels R, G, B, W disposed in the even-numbered rows and the plurality of sub pixels R, G, B, W disposed in the odd-numbered rows may be sensed in the same time period.

In FIG. 7, in a first scan period 1st SCAN and a second scan period 2nd SCAN in which a gate high voltage is applied to any one of odd-numbered gate lines GL1 and a third scan period 3rd SCAN and a fourth scan period 4th SCAN in which a gate high voltage is applied to any one of even-numbered gate lines GL2, states of a plurality of sub pixels disposed in one row are illustrated. Further, the first scan period 1st SCAN, the second scan period 2nd SCAN, the third scan period 3rd SCAN, and the fourth scan period 4th SCAN refer to time periods which are sequentially connected.

Further, sub pixels R, G, B, and W represented with dotted lines refer to sub pixels R, G, B, and W in which a data voltage is applied in the corresponding scan period and the sensing is performed. The sub pixels with a black pattern refer to sub pixels R, G, B, and W in which a data voltage is not applied in the corresponding scan period and the sensing is not performed.

Referring to FIGS. 6 and 7, during the first scan period 1st SCAN and the second scan period 2nd SCAN, one odd-numbered gate voltages GATE1 is gate high voltages. Therefore, the switching transistor SWT and the sensing transistor SET are turned on in the plurality of first sub pixels R disposed in the 8 k-7th column, the plurality of second sub pixels W disposed in the 8 k-6th column, the plurality of third sub pixels B disposed in the 8 k-5th column, and the plurality of fourth sub pixels G disposed in the 8 k-4th column, connected to the any one of odd-numbered gate lines GL1.

Further, during the first scan period 1st SCAN, the data voltage is applied to only any one of the plurality of first sub pixels R disposed in the 8 k-7th column and the plurality of second sub pixels W disposed in the 8 k-6th column, connected to the any one of odd-numbered gate lines GL1, so that the sensing is performed by the first reference voltage line RVL1. Further, the data voltage is applied to only any one of the plurality of third sub pixels B disposed in the 8 k-5th column and the plurality of fourth sub pixels G disposed in the 8 k-4th column, connected to the any one of odd-numbered gate lines GL1, so that the sensing is performed by the second reference voltage line RVL2.

Next, during the second scan period 2nd SCAN, the data voltage is applied to only the other one of the plurality of first sub pixels R disposed in the 8 k-7th column and the plurality of second sub pixels W disposed in the 8 k-6th column, connected to the any one of odd-numbered gate lines GL1, so that the sensing is performed by the first reference voltage line RVL1. Further, the data voltage is applied to only the other one of the plurality of third sub pixels B disposed in the 8 k-5th column and the plurality of fourth sub pixels G disposed in the 8 k-4th column, connected to the any one of odd-numbered gate lines GL1, so that the sensing is performed by the second reference voltage line RVL2.

For example, as illustrated in FIGS. 6 and 7, during the first scan period 1st SCAN, the data voltage is applied to the plurality of first sub pixels R disposed in the 8 k-7th column to perform the sensing by the first reference voltage line RVL1. Further, the data voltage is applied to the plurality of third sub pixels B disposed in the 8 k-5th column to perform the sensing by the second reference voltage line RVL2.

Next, during the second scan period 2nd SCAN, the data voltage is applied to the plurality of second sub pixels W disposed in the 8 k-6th column to perform the sensing by the first reference voltage line RVL1. Further, the data voltage is applied to the plurality of fourth sub pixels G disposed in the 8 k-4th column to perform the sensing by the second reference voltage line RVL2.

Further, during the third scan period 3rd SCAN and the fourth scan period 4th SCAN, one even-numbered gate voltages GATE2 is gate high voltages. Therefore, the switching transistor SWT and the sensing transistor SET are turned on in the plurality of first sub pixels R disposed in the 8 k-3rd column, the plurality of second sub pixels W disposed in the 8 k-2nd column, the plurality of third sub pixels B disposed in the 8 k-1st column, and the plurality of fourth sub pixels G disposed in the 8 k-th column, connected to the any one of even-numbered gate lines GL2.

Further, during the third scan period 3rd SCAN, the data voltage is applied to only any one of the plurality of first sub pixels R disposed in the 8 k-3rd column and the plurality of second sub pixels W disposed in the 8 k-2nd column, connected to the any one of even-numbered gate lines GL2, so that the sensing is performed by the second reference voltage line RVL2. Further, the data voltage is applied to only any one of the plurality of third sub pixels B disposed in the 8 k-1st column and the plurality of fourth sub pixels G disposed in the 8 k-th column, connected to the any one of even-numbered gate lines GL2, so that the sensing is performed by the third reference voltage line RVL3.

Next, during the fourth scan period 4th SCAN, the data voltage is applied to only the other one of the plurality of first sub pixels R disposed in the 8 k-3rd column and the plurality of second sub pixels W disposed in the 8 k-2nd column, connected to the any one of even-numbered gate lines GL2, so that the sensing is performed by the second reference voltage line RVL2. Further, the data voltage is applied to only the other one of the plurality of third sub pixels B disposed in the 8 k-1st column and the plurality of fourth sub pixels G disposed in the 8 k-th column, connected to the any one of even-numbered gate lines GL2, so that the sensing is performed by the third reference voltage line RVL3.

For example, as illustrated in FIGS. 6 and 7, during the third scan period 3rd SCAN, the data voltage is applied to the plurality of first sub pixels R disposed in the 8 k-3rd column to perform the sensing by the second reference voltage line RVL2. Further, the data voltage is applied to the plurality of third sub pixels B disposed in the 8 k-1st column to perform the sensing by the third reference voltage line RVL3.

Next, during the fourth scan period 4th SCAN, the data voltage is applied to the plurality of second sub pixels W disposed in the 8 k-2rd column to perform the sensing by the second reference voltage line RVL2. Further, the data voltage is applied to the plurality of fourth sub pixels G disposed in the 8 k-th column to perform the sensing by the third reference voltage line RVL3.

In the display device 200 according to another exemplary aspect of the present disclosure, in one scan period among a plurality of scan periods, sub pixels R, G, B, and W having different colors may also be sensed.

In the case of the display device of the related art, when the sub pixels having the same color are sensed in one scan period among a plurality of scan periods, it is not sure which of a sensing value measured by the first reference voltage line, a sensing value measured by the second reference voltage line, and a sensing value measured by the third reference voltage line is used to determine the compensation of the data voltage for one color.

Therefore, the display device according to another exemplary aspect of the present disclosure also senses the sub pixels R, G, B, and W having different colors in one scan period among the plurality of scan periods to provide a clear compensation criteria of a data voltage for each color. Accordingly, the display device 200 according to another exemplary aspect of the present disclosure may also more accurately compensate for the data voltage.

Further, in the display device of the related art, in one scan period, only one sub pixel among a plurality of sub pixels disposed in a 8 k-7th column to a 8 k-th column is sensed so that eight scan periods are necessary to sense all the plurality of sub pixels disposed in the 8 k-7th column to 8 k-th column.

In contrast, in the display device 200 according to another exemplary aspect of the present disclosure, in one scan period, two sub pixels among a plurality of sub pixels disposed in a 8 k-7th column to a 8 k-th column are sensed. Therefore, only four scan periods are necessary to sense all the plurality of sub pixels disposed in a 8 k-7th column to a 8 k-th column. Accordingly, the display device 200 according to another exemplary aspect of the present disclosure may also more quickly sense the plurality of sub pixels.

Hereinafter, a display device 300 according to another exemplary aspect (a third exemplary aspect) of the present disclosure will be described in detail with reference to FIGS. 8 and 9. The display device 300 according to still another exemplary aspect (third exemplary aspect) of the present disclosure has a different configuration of a sub pixel from that of the display device 100 according to one exemplary aspect of the present disclosure. Accordingly, the connection relationship of the sub pixel and the reference voltage line of the display device 300 according to another exemplary aspect (third exemplary aspect of the present disclosure will be described in detail below. Therefore, a repeated description of the display device 100 according to one exemplary aspect of the present disclosure and the display device 300 according to still another exemplary aspect (third exemplary aspect) of the present disclosure will be omitted.

Figure 8:
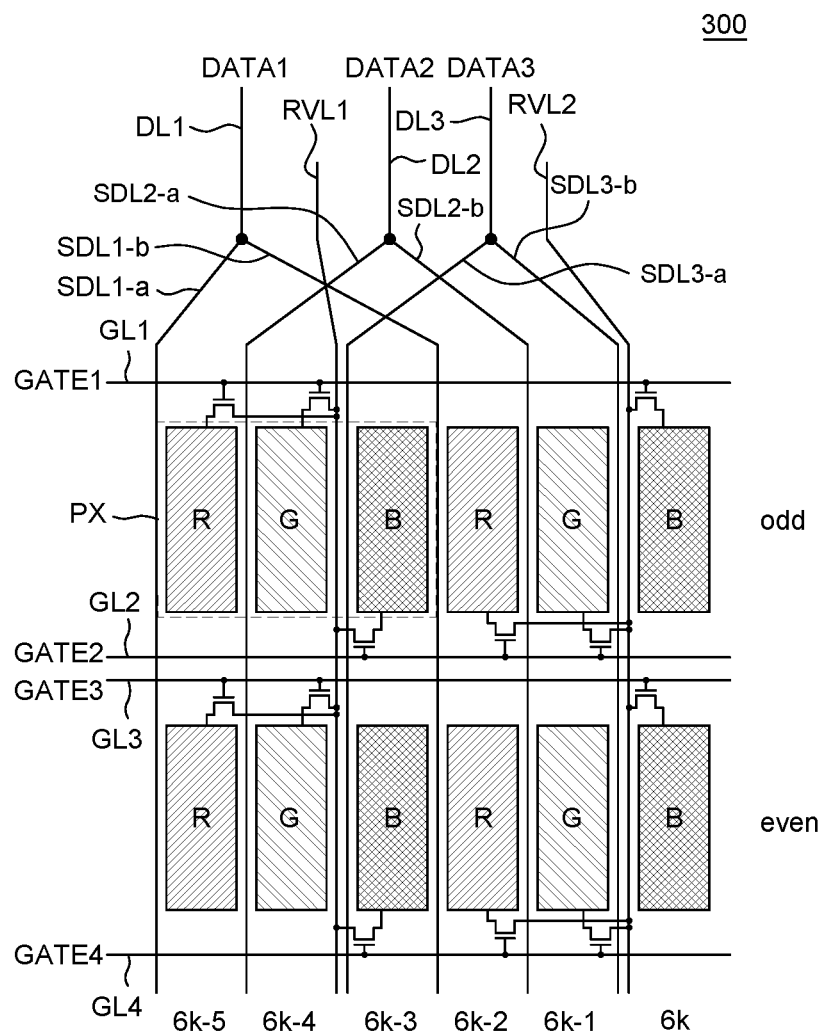
FIG. 8 is a block diagram for explaining a placement relationship of a sub pixel of a display device according to still another exemplary aspect of the present disclosure.

FIG. 8 is a block diagram for explaining a placement relationship of a sub pixel of a display device according to still another exemplary aspect (third exemplary aspect) of the present disclosure.

In FIG. 8, for the convenience of description, only four pixels PX which are disposed in a 2×2 matrix are illustrated and in the display area, the placement relationship of four pixels PX disposed in a 2×2 matrix is repeated. Further, the transistor disposed between the sub pixels R, G, and B and the gate line refers to the sensing transistor SET described with reference to FIG. 2.

Referring to FIG. 8, one pixel PX includes three sub pixels R, G, B. For example, as illustrated in FIG. 8, the pixel PX may include a first sub pixel R, a second sub pixel G, and a third sub pixel B. Further, the first sub pixel R is a red sub pixel, the second sub pixel G is a green sub pixel, and the third sub pixel B is a blue sub pixel. However, the present disclosure is not limited thereto and the plurality of sub pixels may be changed to various colors such as magenta, yellow, and cyan.

The plurality of same color sub pixels R, G, B may be disposed in the same column. That is, the plurality of first sub pixels R is disposed in the same column, the plurality of second sub pixels G is disposed in the same column, and the plurality of third sub pixels B is disposed in the same column.

To be more specific, as illustrated in FIG. 8, the plurality of first sub pixels R is disposed in a 6 k-5th column and a 6 k-2nd column, the plurality of second sub pixels G is disposed in a 6 k-4th column and a 6 k-1st column, and the plurality of third sub pixels B is disposed in a 6 k-3rd column and a 6 k-th column. Here, k refers to a natural number of 1 or larger.

That is, the first sub pixels R, the second sub pixels G, and the third sub pixels B are sequentially repeated with respect to one odd-numbered row or one even-numbered row.

Each of a plurality of data lines DL1, DL2, and DL3 may be divided into a plurality of sub data lines SDL1-a, SDL1-b, SDL2-a, SDL2-b, SDL3-a, SDL3-b, respectively. Specifically, the first data line DL1 is divided into a plurality of first sub data lines SDL1-a and SDL1-b, the second data line DL2 is divided into a plurality of second sub data lines SDL2-a and SDL2-b, and the third data line DL3 is divided into a plurality of third sub data lines SDL3-a and SDL3-b.

The first sub data lines SDL1-a and SDL1-b include a 1-a-th sub data line SDL1-a and a 1-b-th sub data line SDL1-b, and the second sub data lines SDL2-a and SDL2-b include a 2-a-th sub data line SDL2-a and a 2-b-th sub data line SDL2-b. Further, the third sub data lines SDL3-a and SDL3-b include a 3-a-th sub data line SDL3-a and a 3-b-th sub data line SDL3-b.

The plurality of first sub data lines SDL1-a and SDL1-b is disposed to be adjacent to the plurality of first sub pixels R to be connected to the plurality of first sub pixels R.

Specifically, the 1-a-th sub data line SDL1-a is disposed at one side of a plurality of first sub pixels R disposed in the 6 k-5th column to be electrically connected to the plurality of first sub pixels R disposed in the 6 k-5th column. The plurality of 1-b-th sub data lines SDL1-b is disposed between a plurality of first sub pixels R disposed in the 6 k-2nd column and a plurality of third sub pixels B disposed in the 6 k-3rd column to be electrically connected to the plurality of first sub pixels R disposed in the 6 k-2nd column.

The plurality of second sub data lines SDL2-a and SDL2-b is disposed to be adjacent to the second sub pixels G to be connected to the plurality of second sub pixels G.

Specifically, the 2-a-th sub data line SDL2-a is disposed between the plurality of first sub pixels R disposed in the 6 k-5th column and the plurality of second sub pixels G disposed in the 6 k-4th column to be electrically connected to the plurality of second sub pixels G disposed in the 6 k-4th column. The 2-b-th sub data line SDL2-b is disposed between the plurality of first sub pixels R disposed in the 6 k-2nd column and the plurality of second sub pixels G disposed in the 6 k-1st column to be electrically connected to the plurality of second sub pixels G disposed in the 6 k-1st column.

The plurality of third sub data lines SDL3-a and SDL3-b is disposed to be adjacent to the plurality of third sub pixels B to be connected to the plurality of third sub pixels B.

Specifically, the 3-a-th sub data line SDL3-a is disposed between the plurality of third sub pixels B disposed in the 6 k-3rd column and the plurality of second sub pixels G disposed in the 6 k-4th column to be electrically connected to the plurality of third sub pixels B disposed in the 6 k-3rd column. The 3-b-th sub data line SDL3-b is disposed between the plurality of third sub pixels B disposed in the 6 k-th column and the plurality of second sub pixels G disposed in the 6 k-1st column to be electrically connected to the plurality of third sub pixels B disposed in the 6 k-th column.

A first data voltage DATA1 which is a red data voltage is applied to the first data line DL1, a second data voltage DATA2 which is a green data voltage is applied to the second data line DL2, and a third data voltage DATA3 which is a blue data voltage is applied to the third data line DL3.

Therefore, the first data voltage DATA1 which is a red data voltage is applied to the plurality of first sub data lines SDL1-a and SDL1-b, and the second data voltage DATA2 which is a green data voltage is applied to the plurality of second sub data line SDL2-a and SDL2-b. Further, the third data voltage DATA3 which is a blue data voltage is applied to the plurality of third sub data lines SDL3-a and SDL3-b.

Each of the plurality of gate lines GL1 to GL4 may be disposed on both sides of the plurality of sub pixels R, G, B and two gate lines GL2 and GL3 may be disposed between the plurality of sub pixels R, G, B.

Specifically, referring to FIG. 8, the first gate line GL1 and the second gate line GL2 are disposed on both sides of the plurality of sub pixels R, G, B in the odd-numbered rows and the third gate line GL3 and the fourth gate line GL4 are disposed on both sides of the plurality of sub pixels R, G, B in the even-numbered rows. Therefore, the second gate line GL2 and the third gate line GL3 are disposed between the plurality of sub pixels R, G, B in the odd-numbered rows and the plurality of sub pixels R, G, B in the even-numbered rows.

In the meantime, in one pixel PX, the first sub pixel R and the second sub pixel G are connected to the same gate lines GL1 to GL4 and in one pixel PX, the third sub pixel B may be connected to a different gate line GL1 to GL4.

Sub pixels R, G, B having the same color which are adjacent to each other in one row may be connected to different gate lines GL1 to GL4. That is, in one row, adjacent first sub pixels R are connected to different gate lines GL1 to GL4, adjacent second sub pixels G are connected to different gate lines GL1 to GL4, and adjacent third sub pixels B are connected to different gate lines GL1 to GL4.

In the other words, the plurality of first sub pixels R disposed in the 6 k-5th column, the plurality of second sub pixels G disposed in the 6 k-4th column, and the plurality of third sub pixels B disposed in the 6 k-th column are connected to the odd-numbered gate lines GL1 and GL3. Further, the plurality of first sub pixels R disposed in the 6 k-2nd column, the plurality of second sub pixels G disposed in the 6 k-1st column, and the plurality of third sub pixels B disposed in the 6 k-3rd column are connected to the even-numbered gate lines GL2 and GL4.

For example, as illustrated in FIG. 8, in the odd-numbered rows, the plurality of first sub pixels R disposed in the 6 k-5th column is connected to the first gate line GL1 and the plurality of first sub pixels R disposed in the 6 k-2nd column adjacent thereto is connected to the second gate line GL2. Further, in the odd-numbered rows, the plurality of second sub pixels G disposed in the 6 k-4th column is connected to the first gate line GL1 and the plurality of second sub pixels G disposed in the 6 k-1st column adjacent thereto is connected to the second gate line GL2. Further, in the odd-numbered rows, the plurality of third sub pixels B disposed in the 6 k-3rd column is connected to the second gate line GL2 and the plurality of third sub pixels B disposed in the 6 k-th column adjacent thereto is connected to the first gate line GL1.

Further, as illustrated in FIG. 8, in the even-numbered rows, the plurality of first sub pixels R disposed in the 6 k-5th column is connected to the third gate line GL3 and the plurality of first sub pixels R disposed in the 6 k-2nd column adjacent thereto is connected to the fourth gate line GL4. In the even-numbered rows, the plurality of second sub pixels G disposed in the 6 k-4th column is connected to the third gate line GL3 and the plurality of second sub pixels G disposed in the 6 k-1st column adjacent thereto is connected to the fourth gate line GL4. In the even-numbered rows, the plurality of third sub pixels B disposed in the 6 k-3rd column is connected to the fourth gate line GL4 and the plurality of third sub pixels B disposed in the 6 k-th column adjacent thereto is connected to the third gate line GL3.

Each of the plurality of reference voltage lines RVL1 and RVL2 may be disposed in one pixel PX.

Specifically, the first reference voltage line RVL1 is disposed between the plurality of second sub pixels G disposed in the 6 k-4th column and the plurality of third sub pixels B disposed in the 6 k-3rd column. Therefore, the plurality of first sub pixels R disposed in the 6 k-5th column, the plurality of second sub pixels G disposed in the 6 k-4th column, and the plurality of third sub pixels B disposed in the 6 k-3rd column may be connected to the first reference voltage line RVL1.

Further, the second reference voltage line RVL2 is disposed between the plurality of second sub pixels G disposed in the 6 k-1st column and the plurality of third sub pixels B disposed in the 6 k-th column. Therefore, the plurality of first sub pixels R disposed in the 6 k-2nd column, the plurality of second sub pixels G disposed in the 6 k-1st column, and the plurality of third sub pixels B disposed in the 6 k-th column may be connected to the second reference voltage line RVL2.

Hereinafter, a sensing method of a display device 300 according to still another exemplary aspect (third exemplary aspect) of the present disclosure will be described with reference to FIG. 9.

Figure 9:
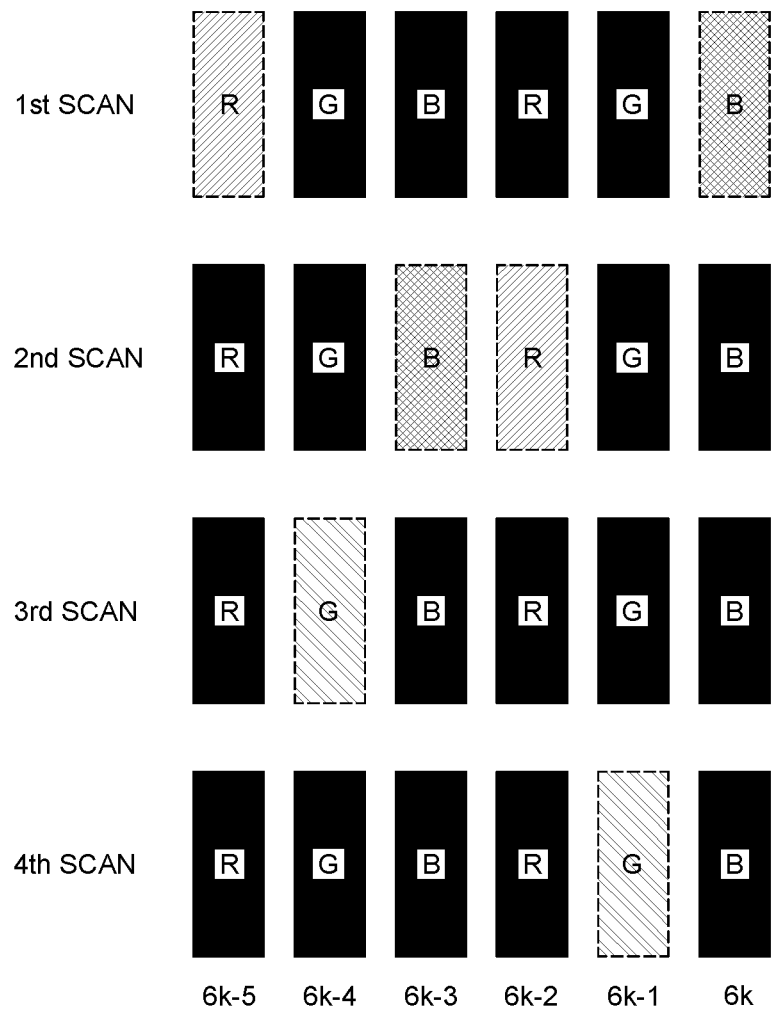
FIG. 9 is a view for explaining a sensing method of a display device according to still another exemplary aspect of the present disclosure.

FIG. 9 is a view for explaining a sensing method of a display device according to still another exemplary aspect (third exemplary aspect) of the present disclosure.

In FIG. 9, in the odd-numbered rows illustrated in FIG. 8, a sensing order for a plurality of sub pixels R, G, B disposed in the 6 k-5-th column to 6 k-th column is illustrated. However, in the even-numbered rows, the sensing order for each of the plurality of sub pixels R, G, B disposed in the 6 k-5-th column to 6 k-th column may be the same as the sensing order for each of the plurality of sub pixels R, G, B disposed in the 6 k-5-th column to 6 k-th column in the odd-numbered rows. However, the present disclosure is not limited thereto and the sensing order for each of the plurality of sub pixels R, G, B may vary in various ways. Further, the plurality of sub pixels R, G, B disposed in the even-numbered rows and the plurality of sub pixels R, G, B disposed in the odd-numbered rows may be sensed in different time periods. However, the present disclosure is not limited thereto and the plurality of sub pixels R, G, B disposed in the even-numbered rows and the plurality of sub pixels R, G, B disposed in the odd-numbered rows may be sensed in the same time period.

FIG. 9 illustrates a state of a plurality of sub pixels disposed in each row in a first scan period 1st SCAN and a third scan period 3rd SCAN in which a gate high voltage is applied to a first gate line GL1 which is one of odd-numbered gate lines and each row in a second scan period 2nd SCAN and a fourth scan period 4th SCAN in which a gate high voltage is applied to a second gate line GL2 which is one of even-numbered gate lines. The first scan period 1st SCAN, the second scan period 2nd SCAN, the third scan period 3rd SCAN, and the fourth scan period 4th SCAN refer to time periods which are sequentially connected.

Sub pixels R, G, B represented with dotted lines refer to sub pixels R, G, B in which a data voltage is applied and the sensing is performed, in the corresponding scan period. The sub pixels R, G, B with a black pattern refer to sub pixels R, G, B in which a data voltage is not applied and the sensing is not performed, in the corresponding scan period.

Referring to FIGS. 8 and 9, during the first scan period 1st SCAN, since the first gate voltage GATE1 is a gate high voltage, in the plurality of first sub pixels R disposed in the 6 k-5th column, the plurality of second sub pixel G disposed in the 6 k-4th column, and the plurality of third sub pixels B disposed in the 6 k-th column, which are connected to the first gate line GL1, the switching transistor SWT and the sensing transistor SET are turned on.

During the first scan period 1st SCAN, the data voltage is applied to only one of the plurality of first sub pixels R disposed in the 6 k-5th column and the plurality of second sub pixels G disposed in the 6 k-4th column, connected to the first gate line GL1, to be sensed by the first reference voltage line RVL1. Further, the data voltage is applied to the plurality of third sub pixels B disposed in the 6 k-th column connected to the first gate line GL1, to be sensed by the second reference voltage line RVL2.

For example, as illustrated in FIGS. 8 and 9, during the first scan period 1st SCAN, the data voltage is applied to the plurality of first sub pixels R disposed in the 6 k-5th column to be sensed by the first reference voltage line RVL1. Further, the data voltage is applied to the plurality of third sub pixels B disposed in the 6 k-th column to be sensed by the second reference voltage line RVL2.

During the subsequent second scan period 2nd SCAN, the data voltage is applied to the plurality of third sub pixels B disposed in the 6 k-3rd column connected to the second gate line GL2 to be sensed by the first reference voltage line RVL1. Further, the data voltage is applied to only one of the plurality of first sub pixels R disposed in the 6 k-2nd column and the plurality of second sub pixels G disposed in the 6 k-1st column, connected to the second gate line GL2, to be sensed by the second reference voltage line RVL2.

For example, as illustrated in FIGS. 8 and 9, during the second scan period 2nd SCAN, the data voltage is applied to the plurality of third sub pixels B disposed in the 6 k-3rd column to be sensed by the first reference voltage line RVL1. Further, the data voltage is applied to the plurality of first sub pixels R disposed in the 6 k-2nd column to be sensed by the second reference voltage line RVL2.

During the subsequent third scan period 3rd SCAN, the data voltage is applied to only the other one of the plurality of first sub pixels R disposed in the 6 k-5th column and the plurality of second sub pixels G disposed in the 6 k-4th column, connected to the first gate line GL1, to be sensed by the first reference voltage line RVL1.

For example, as illustrated in FIGS. 8 and 9, during the third scan period 3rd SCAN, the data voltage is applied to the plurality of second sub pixels G disposed in the 6 k-4th column to be sensed by the first reference voltage line RVL1.

During the subsequent fourth scan period 4th SCAN, the data voltage is applied to only the other one of the plurality of first sub pixels R disposed in the 6 k-2nd column and the plurality of second sub pixels G disposed in the 6 k-1st column, connected to the second gate line GL2, to be sensed by the second reference voltage line RVL2.

For example, as illustrated in FIGS. 8 and 9, during the fourth scan period 4th SCAN, the data voltage is applied to the plurality of second sub pixels G disposed in the 6 k-1st column to be sensed by the second reference voltage line RVL2.

As described above, during one scan period among a plurality of scan periods, sub pixels R, G, B having different colors may be sensed.

In the case of the display device of the related art, when the sub pixels having the same color are sensed in one scan period among a plurality of scan periods, it is not sure which of a sensing value measured by the first reference voltage line and a sensing value measured by the second reference voltage line is used to determine the compensation of the data voltage for one color.

Therefore, the display device 300 according to another exemplary aspect (third exemplary aspect) of the present disclosure senses the sub pixels R, G, B having different colors in one scan period among the plurality of scan periods to provide a clear compensation criteria of a data voltage for each color. Accordingly, the display device 300 according to another exemplary aspect (third exemplary aspect) of the present disclosure may more accurately compensate for the data voltage DATA.

Further, in the display device of the related art, in one scan period, only one sub pixel among a plurality of sub pixels disposed in a 6 k-5th column to a 6 k-th column is sensed so that six scan periods are necessary to sense all the plurality of sub pixels disposed in the 6 k-5th column to 6 k-th column.

In contrast, in the display device 300 according to another exemplary aspect (Example 3) of the present disclosure, in one scan period, two or one sub pixel among a plurality of sub pixels R, G, B disposed in a 6 k-5th column to a 6 k-th column are sensed. Therefore, only four scan periods are necessary to sense all the plurality of sub pixels R, G, B disposed in a 6 k-5th column to a 6 k-th column. Accordingly, the display device 300 according to another exemplary aspect (third exemplary aspect) of the present disclosure may more quickly sense the plurality of sub pixels.

Hereinafter, a display device 400 according to still another exemplary aspect (fourth exemplary aspect) of the present disclosure will be described in detail with reference to FIGS. 10 and 11. The display device 400 according to still another exemplary aspect (fourth exemplary aspect) of the present disclosure and the display device 300 according to another exemplary aspect (third exemplary aspect) of the present disclosure have different connection relationship of the sub pixel and the reference voltage line. Accordingly, the connection relationship of the sub pixel and the reference voltage line of the display device 400 according to still another exemplary aspect (fourth exemplary aspect) of the present disclosure will be described in detail below. Therefore, a repeated description of the display device 400 according to still another exemplary aspect (fourth exemplary aspect) of the present disclosure and the display device 300 according to still another exemplary aspect (third exemplary aspect) of the present disclosure will be omitted.

Figure 10:
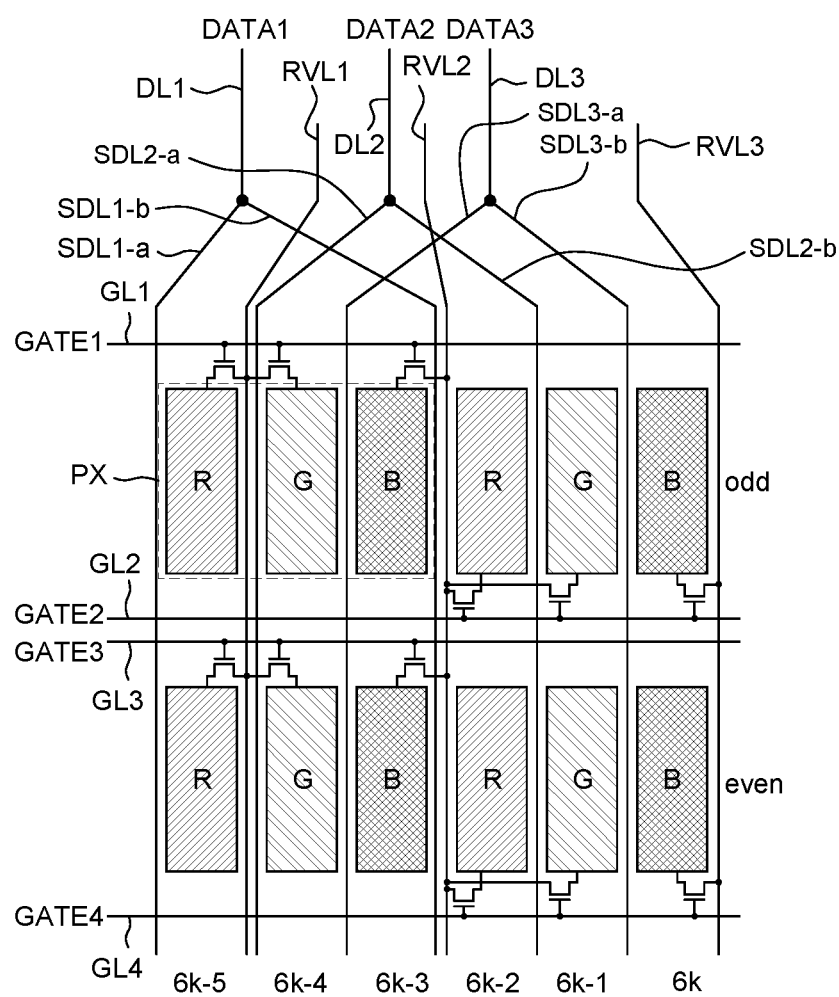
FIG. 10 is a block diagram for explaining a placement relationship of a sub pixel of a display device according to still another exemplary aspect of the present disclosure.

FIG. 10 is a block diagram for explaining a placement relationship of a sub pixel of a display device according to still another exemplary aspect (fourth exemplary aspect) of the present disclosure.

Each of the plurality of gate lines GL1 to GL4 may be disposed on both sides of the plurality of sub pixels R, G, B and two gate lines GL2 and GL3 may be disposed between the plurality of sub pixels R, G, B.

Specifically, referring to FIG. 10, the first gate line GL1 and the second gate line GL2 are disposed on both sides of the plurality of sub pixels R, G, B in the odd-numbered rows and the third gate line GL3 and the fourth gate line GL4 are disposed on both sides of the plurality of sub pixels R, G, B in the even-numbered rows. Therefore, the second gate line GL2 and the third gate line GL3 are disposed between the plurality of sub pixels R, G, B in the odd-numbered rows and the plurality of sub pixels R, G, B in the even-numbered rows.

In the meantime, each of the plurality of pixels PX is connected to the same gate line GL1 to GL4 and adjacent pixels PX among the plurality of pixels PX may be connected to different gate lines GL1 to GL4.

In the other words, the plurality of first sub pixels R disposed in the 6 k-5th column, the plurality of second sub pixels G disposed in the 6 k-4th column, and the plurality of third sub pixels B disposed in the 6 k-3rd column are connected to the odd-numbered gate lines GL1 and GL3. Further, the plurality of first sub pixels R disposed in the 6 k-2nd column, the plurality of second sub pixels G disposed in the 6 k-1st column, and the plurality of third sub pixels B disposed in the 6 k-th column are connected to the even-numbered gate lines GL2 and GL4.

Specifically, referring to FIG. 10, the sub pixels R, G, B included in pixels PX disposed in the 6 k-5th column to 6 k-3rd column of the odd-numbered rows are connected to the first gate line GL1. The sub pixels R, G, B included in pixels PX disposed in the 6 k-2nd column to 6 k-th column of the odd-numbered rows are connected to the second gate line GL2. The sub pixels R, G, B included in pixels PX disposed in the 6 k-5th column to 6 k-3rd column of the even-numbered rows are connected to the third gate line GL3. The sub pixels R, G, B included in pixels PX disposed in the 6 k-2nd column to 6 k-th column of the even-numbered rows are connected to the fourth gate line GL4.

The first reference voltage line RVL1 is disposed in one pixel PX, but the second reference voltage line RVL2 and the third reference voltage line RVL3 may be disposed between pixels PX.

Specifically, the first reference voltage line RVL1 is disposed between the plurality of first sub pixels R disposed in the 6 k-5th column and the plurality of second sub pixels G disposed in the 6 k-4th column. Therefore, the plurality of first sub pixels R disposed in the 6 k-5th column and the plurality of second sub pixels G disposed in the 6 k-4th column may be connected to the first reference voltage line RVL1.

Specifically, the second reference voltage line RVL2 is disposed between the plurality of third sub pixels B disposed in the 6 k-3rd column and the plurality of first sub pixels R disposed in the 6 k-2nd column. Therefore, the plurality of third sub pixels B disposed in the 6 k-3rd column, the plurality of first sub pixels R disposed in the 6 k-2nd column, and the plurality of second sub pixels G disposed in the 6 k-1st column may be connected to the second reference voltage line RVL2.

The third reference voltage line RVL3 is disposed to be adjacent to the plurality of third sub pixels B disposed in the 6 k-th column so that the plurality of third sub pixels B disposed in the 6 k-th column may be connected to the third reference voltage line RVL3.

Even though not illustrated in FIG. 10, the third reference voltage line RVL3 may also be connected to the plurality of first sub pixels R and the plurality of second sub pixels G which are disposed to be adjacent thereto.

Hereinafter, a sensing method of a display device 400 according to still another exemplary aspect (fourth exemplary aspect) of the present disclosure will be described with reference to FIG. 11.

Figure 11:
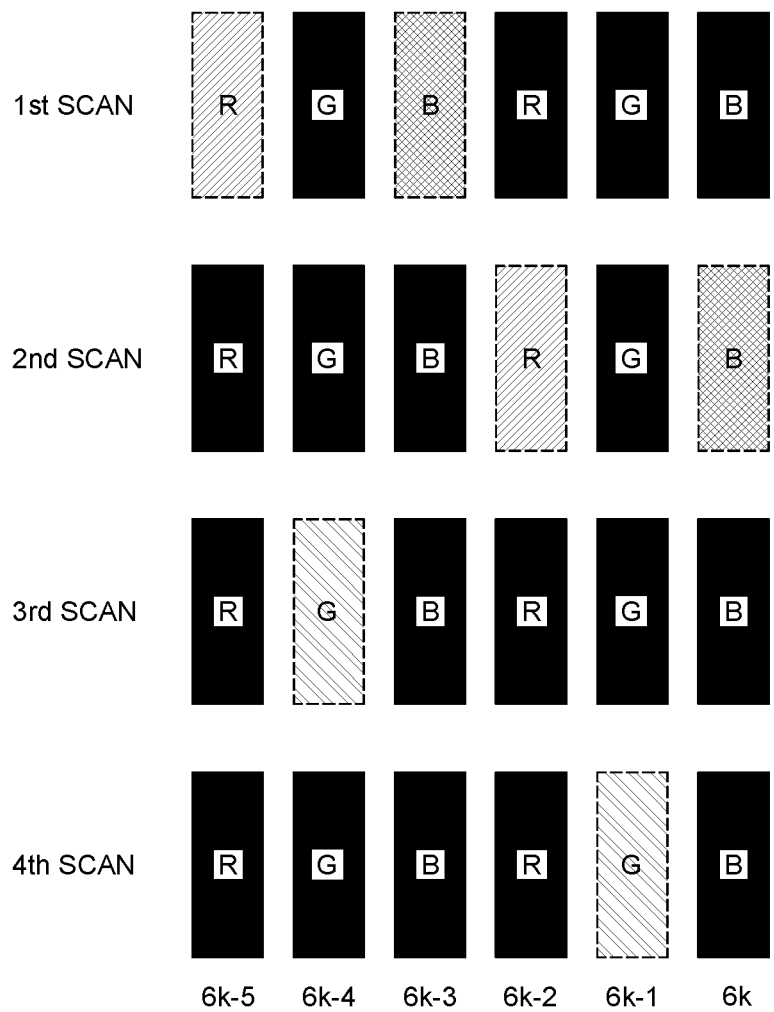
FIG. 11 is a view for explaining a sensing method of a display device according to still another exemplary aspect of the present disclosure.

FIG. 11 is a view for explaining a sensing method of a display device according to still another exemplary aspect (fourth exemplary aspect) of the present disclosure.

In FIG. 11, in the odd-numbered rows illustrated in FIG. 10, a sensing order for each of a plurality of sub pixels R, G, B disposed in the 6 k-5th column to 6 k-th column is illustrated. However, in the even-numbered rows, the sensing order for each of the plurality of sub pixels R, G, B disposed in the 6 k-5th column to 6 k-th column may be the same as the sensing order for each of the plurality of sub pixels R, G, B disposed in the 6 k-5th column to 6 k-th column in the odd-numbered rows. However, the present disclosure is not limited thereto and the sensing order for each of the plurality of sub pixels R, G, B may vary in various ways. Further, the plurality of sub pixels R, G, B disposed in the even-numbered rows and the plurality of sub pixels R, G, B disposed in the odd-numbered rows may be sensed in different time periods. However, the present disclosure is not limited thereto and the plurality of sub pixels R, G, B disposed in the even-numbered rows and the plurality of sub pixels R, G, B disposed in the odd-numbered rows may be sensed in the same time period.

FIG. 11 illustrates a state of a plurality of sub pixels disposed in each row in a first scan period 1st SCAN and a third scan period 3rd SCAN in which a gate high voltage is applied to a first gate line GL1 which is one of odd-numbered gate lines and each row in a second scan period 2nd SCAN and a fourth scan period 4th SCAN in which a gate high voltage is applied to a second gate line GL2 which is one of even-numbered gate lines. The first scan period 1st SCAN, the second scan period 2nd SCAN, the third scan period 3rd SCAN, and the fourth scan period 4th SCAN refer to time periods which are sequentially connected.

Sub pixels R, G, B represented with dotted lines refer to sub pixels R, G, B in which a data voltage is applied in the corresponding scan period and the sensing is performed. The sub pixels R, G, B with a black pattern refer to sub pixels R, G, B in which a data voltage is not applied and the sensing is not performed, in the corresponding scan period.

Referring to FIGS. 10 and 11, during the first scan period 1st SCAN, since the first gate voltage GATE1 is a gate high voltage, in the plurality of first sub pixels R disposed in the 6 k-5th column, the plurality of second sub pixel G disposed in the 6 k-4th column, and the plurality of third sub pixels B disposed in the 6 k-3rd column, which are connected to the first gate line GL1, the switching transistor SWT and the sensing transistor SET are turned on.

In the first scan period 1st SCAN, the data voltage is applied to only one of the plurality of first sub pixels R disposed in the 6 k-5th column and the plurality of second sub pixels G disposed in the 6 k-4th column, connected to the first gate line GL1, to be sensed by the first reference voltage line RVL1. Further, the data voltage is applied to the plurality of third sub pixels B disposed in the 6 k-3rd column connected to the first gate line GL1, to be sensed by the second reference voltage line RVL2.

For example, as illustrated in FIGS. 10 and 11, during the first scan period 1st SCAN, the data voltage is applied to the plurality of first sub pixels R disposed in the 6 k-5th column to be sensed by the first reference voltage line RVL1. Further, the data voltage is applied to the plurality of third sub pixels B disposed in the 6 k-3rd column to be sensed by the second reference voltage line RVL2.

In the subsequent second scan period 2nd SCAN, the data voltage is applied to only one of the plurality of first sub pixels R disposed in the 6 k-2nd column and the plurality of second sub pixels G disposed in the 6 k-1st column, connected to the second gate line GL2, to be sensed by the second reference voltage line RVL2. Further, the data voltage is applied to the plurality of third sub pixels B disposed in the 6 k-th column connected to the second gate line GL2, to be sensed by the third reference voltage line RVL3.

For example, as illustrated in FIGS. 10 and 11, during the second scan period 2nd SCAN, the data voltage is applied to the plurality of first sub pixels R disposed in the 6 k-2nd column to be sensed by the second reference voltage line RVL2. Further, the data voltage is applied to the plurality of third sub pixels B disposed in the 6 k-th column to be sensed by the third reference voltage line RVL3.

During the subsequent third scan period 3rd SCAN, the data voltage is applied to only the other one of the plurality of first sub pixels R disposed in the 6 k-5th column and the plurality of second sub pixels G disposed in the 6 k-4th column, connected to the first gate line GL1, to be sensed by the first reference voltage line RVL1.

For example, as illustrated in FIGS. 10 and 11, during the third scan period 3rd SCAN, the data voltage is applied to the plurality of second sub pixels G disposed in the 6 k-4th column to be sensed by the first reference voltage line RVL1.

During the subsequent fourth scan period 4th SCAN, the data voltage is applied to only the other one of the plurality of first sub pixels R disposed in the 6 k-2nd column and the plurality of second sub pixels G disposed in the 6 k-1st column, connected to the second gate line GL2, to be sensed by the second reference voltage line RVL2.

For example, as illustrated in FIGS. 10 and 11, during the fourth scan period 4th SCAN, the data voltage is applied to the plurality of second sub pixels G disposed in the 6 k-1st column to be sensed by the second reference voltage line RVL2.

As described above, during one scan period among a plurality of scan periods, sub pixels R, G, B having different colors may be sensed.

In the case of the display device of the related art, when the sub pixels having the same color are sensed in one scan period among a plurality of scan periods, it is not sure which of a sensing value measured by the first reference voltage line and a sensing value measured by the second reference voltage line is used to determine the compensation of the data voltage for one color.

Therefore, the display device 400 according to another exemplary aspect (fourth exemplary aspect) of the present disclosure senses the sub pixels R, G, B having different colors in one scan period among the plurality of scan periods to provide a clear compensation criteria of a data voltage for each color. Accordingly, the display device 400 according to another exemplary aspect (fourth exemplary aspect) of the present disclosure may more accurately compensate for the data voltage DATA.

Further, in the display device of the related art, in one scan period, only one sub pixel among a plurality of sub pixels disposed in a 6 k-5th column to a 6 k-th column is sensed so that six scan periods are necessary to sense all the plurality of sub pixels disposed in the 6 k-5th column to 6 k-th column.

In contrast, in the display device 400 according to still another exemplary aspect (fourth exemplary aspect) of the present disclosure, in one scan period, two or one sub pixel among a plurality of sub pixels R, G, B disposed in a 6 k-5th column to a 6 k-th column is sensed. Therefore, only four scan periods are necessary to sense all the plurality of sub pixels R, G, B disposed in the 6 k-5th column to the 6 k-th column. Accordingly, the display device 400 according to another exemplary aspect (fourth exemplary aspect) of the present disclosure may more quickly sense the plurality of sub pixels.

Hereinafter, a display device 500 according to still another exemplary aspect (fifth exemplary aspect) of the present disclosure will be described in detail with reference to FIGS. 12 and 13. The display device 500 according to still another exemplary aspect (fifth exemplary aspect) of the present disclosure and the display device 400 according to another exemplary aspect (fourth exemplary aspect) of the present disclosure have different connection relationship between the sub pixel and the reference voltage line. Accordingly, the connection relationship of the sub pixel and the reference voltage line of the display device 500 according to still another exemplary aspect (fifth exemplary aspect) of the present disclosure will be described in detail below. Therefore, repeated description of the display device 500 according to still another exemplary aspect (fifth exemplary aspect) of the present disclosure and the display device 400 according to still another exemplary aspect (fourth exemplary aspect) of the present disclosure will be omitted.

Figure 12:
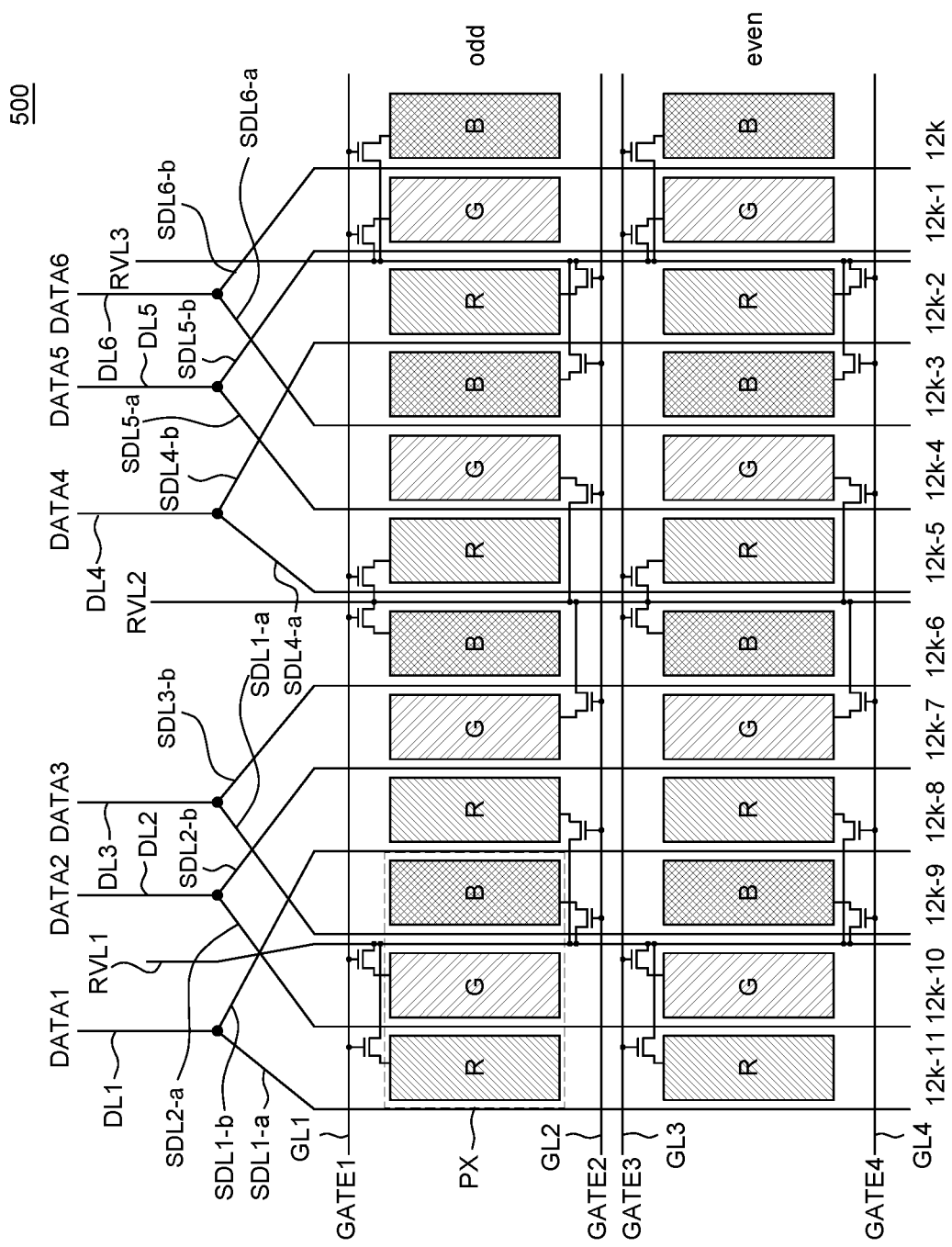
FIG. 12 is a block diagram for explaining a placement relationship of a sub pixel of a display device according to still another exemplary aspect of the present disclosure.

FIG. 12 is a block diagram for explaining a placement relationship of a sub pixel of a display device according to still another exemplary aspect (fifth exemplary aspect) of the present disclosure.

In FIG. 12, for the convenience of description, only eight pixels PX which are disposed in a 4×2 matrix are illustrated and in the display area, the placement relationship of eight pixels PX disposed in a 4×2 matrix is repeated. Further, the transistor disposed between the sub pixels R, G, B and the gate line refers to the sensing transistor SET described with reference to FIG. 2.

Referring to FIG. 12, one pixel PX includes three sub pixels R, G, B. For example, as illustrated in FIG. 12, the pixel PX may include a first sub pixel R, a second sub pixel G, and a third sub pixel B. Further, the first sub pixel R is a red sub pixel, the second sub pixel G is a green sub pixel, and the third sub pixel B is a blue sub pixel. However, the present disclosure is not limited thereto and the plurality of sub pixels may be changed to various colors such as magenta, yellow, and cyan.

The plurality of same color sub pixels R, G, B may be disposed in the same column. That is, the plurality of first sub pixels R is disposed in the same column, the plurality of second sub pixels G is disposed in the same column, and the plurality of third sub pixels B is disposed in the same column.

To be more specific, as illustrated in FIG. 12, the plurality of first sub pixels R is disposed in a 12 k-11th column, a 12 k-8th column, a 12 k-5th column, and a 12 k-2nd column. Further, the plurality of second sub pixels G is disposed in a 12 k-10th column, a 12 k-7th column, a 12 k-4th column, and a 12 k-1st column, and the plurality of third sub pixels B is disposed in a 12 k-9th column, a 12 k-6th column, a 12 k-3rd column, and a 12 k-th column. Here, k refers to a natural number of 1 or larger.

That is, the first sub pixels R, the second sub pixels G, and the third sub pixels B are sequentially repeated with respect to one odd-numbered row or one even-numbered row.

A plurality of data lines DL1, DL2, DL3, DL4, DL5, DL6 may be divided into a plurality of sub data lines SDL1-a, SDL1-b, SDL2-a, SDL2-b, SDL3-a, SDL3-b, SDL4-a, SDL4-b, SDL5-a, SDL5-b, SDL6-a, SDL6-b, respectively. Specifically, the first data line DL1 is divided into a plurality of first sub data lines SDL1-a and SDL1-b and the second data line DL2 is divided into a plurality of second sub data lines SDL2-a and SDL2-b. Further, the third data line DL3 is divided into a plurality of third sub data lines SDL3-a and SDL3-b and the fourth data line DL4 is divided into a plurality of fourth sub data lines SDL4-a and SDL4-b. Further, the fifth data line DL5 is divided into a plurality of fifth sub data lines SDL5-a and SDL5-b and the sixth data line DL6 is divided into a plurality of sixth sub data lines SDL6-a and SDL6-b.

The first sub data lines SDL1-a and SDL1-b may include a 1-a-th sub data line SDL1-a and a 1-b-th sub data line SDL1-b and the second sub data lines SDL2-a and SD2L-b include a 2-a-th sub data line SDL2-a and a 2-b-th sub data line SDL2-b. Further, the third sub data lines SDL3-a and SDL3-b include a 3-a-th sub data line SDL3-a and a 3-b-th sub data line SDL3-b and the fourth sub data lines SDL4-a and SDL4-b include a 4-a-th sub data line SDL4-a and a 4-b-th sub data line SDL4-b. Further, the fifth sub data lines SDL5-a and SDL5-b include a 5-a-th sub data line SDL5-a and a 5-b-th sub data line SDL5-b and the sixth sub data lines SDL6-a and SDL6-b include a 6-a-th sub data line SDL6-a and a 6-b-th sub data line SDL6-b.

The plurality of first sub data lines SDL1-a and SDL1-b is disposed to be adjacent to the plurality of first sub pixels R to be connected to the plurality of first sub pixels R.

Specifically, the 1-a-th sub data line SDL1-a is disposed at one side of a plurality of first sub pixels R disposed in the 12 k-11th column to be electrically connected to the plurality of first sub pixels R disposed in the 12 k-11th column. The plurality of 1-b-th sub data lines SDL1-b is disposed between the plurality of first sub pixels R disposed in the 12 k-8th column and the plurality of third sub pixels B disposed in the 12 k-9th column to be electrically connected to the plurality of first sub pixels R disposed in the 12 k-8th column.

The plurality of second sub data lines SDL2-a and SDL2-b is disposed to be adjacent to the second sub pixels G to be connected to the plurality of second sub pixels G.

Specifically, the 2-a-th sub data line SDL2-a is disposed between the plurality of first sub pixels R disposed in the 12 k-11th column and the plurality of second sub pixels G disposed in the 12 k-10th column to be electrically connected to the plurality of second sub pixels G disposed in the 12 k-10th column. The 2-b-th sub data line SDL2-b is disposed between the plurality of first sub pixels R disposed in the 12 k-8th column and the plurality of second sub pixels G disposed in the 12 k-7th column to be electrically connected to the plurality of second sub pixels G disposed in the 12 k-7th column.

The plurality of third sub data lines SDL3-a and SDL3-b is disposed to be adjacent to the plurality of third sub pixels B to be connected to the plurality of third sub pixels B.

Specifically, the 3-a-th sub data line SDL3-a is disposed between the plurality of third sub pixels B disposed in the 12 k-9th column and the plurality of second sub pixels G disposed in the 12 k-10th column to be electrically connected to the plurality of third sub pixels B disposed in the 12 k-9th column. The 3-b-th sub data line SDL3-b is disposed between the plurality of third sub pixels B disposed in the 12 k-6th column and the plurality of second sub pixels G disposed in the 12 k-7th column to be electrically connected to the plurality of third sub pixels B disposed in the 12 k-6th column.

The plurality of fourth sub data lines SDL4-a and SDL4-b is disposed to be adjacent to the plurality of first sub pixels R to be connected to the plurality of first sub pixels R.

Specifically, the 4-a-th sub data line SDL4-a is disposed between the plurality of first sub pixels R disposed in the 12 k-5th column and the plurality of third sub pixels B disposed in the 12 k-6th column to be electrically connected to the plurality of first sub pixels R disposed in the 12 k-5th column. The plurality of 4-b-th sub data lines SDL4-b is disposed between the plurality of first sub pixels R disposed in the 12 k-2nd column and the plurality of third sub pixels B disposed in the 12 k-3rd column to be electrically connected to the plurality of first sub pixels R disposed in the 12 k-2nd column.

The plurality of fifth sub data lines SDL5-a and SDL5-b is disposed to be adjacent to the second sub pixels G to be connected to the plurality of second sub pixels G.

Specifically, the 5-a-th sub data line SDL5-a is disposed between the plurality of first sub pixels R disposed in the 12 k-5th column and the plurality of second sub pixels G disposed in the 12 k-4th column to be electrically connected to the plurality of second sub pixels G disposed in the 12 k-4th column. The 5-b-th sub data line SDL5-b is disposed between the plurality of first sub pixels R disposed in the 12 k-2nd column and the plurality of second sub pixels G disposed in the 12 k-1st column to be electrically connected to the plurality of second sub pixels G disposed in the 12 k-1st column.

The plurality of sixth sub data lines SDL6-a and SDL6-b is disposed to be adjacent to the plurality of third sub pixels B to be connected to the plurality of third sub pixels B.

Specifically, the 6-a-th sub data line SDL6-a is disposed between the plurality of third sub pixels B disposed in the 12 k-3rd column and the plurality of second sub pixels G disposed in the 12 k-4th column to be electrically connected to the plurality of third sub pixels B disposed in the 12 k-3rd column. The 6-b-th sub data line SDL6-b is disposed between the plurality of third sub pixels B disposed in the 12 k-th column and the plurality of second sub pixels G disposed in the 12 k-1st column to be electrically connected to the plurality of third sub pixels B disposed in the 12 k-th column.

A first data voltage DATA1 which is a red data voltage is applied to the first data line DL1 and a second data voltage DATA2 which is a green data voltage is applied to the second data line DL2. Further, a third data voltage DATA3 which is a blue data voltage is applied to the third data line DL3 and a fourth data voltage DATA4 which is a red data voltage is applied to the fourth data line DL4. Further, a fifth data voltage DATA5 which is a green data voltage is applied to the fifth data line DL5 and a sixth data voltage DATA6 which is a blue data voltage is applied to the sixth data line DL6.

Therefore, the first data voltage DATA1 which is a red data voltage is applied to the plurality of first sub data lines SDL1-a and SDL1-b and the second data voltage DATA2 which is a green data voltage is applied to the plurality of second sub data line SDL2-a and SDL2-b. Further, the third data voltage DATA3 which is a blue data voltage is applied to the plurality of third sub data lines SDL3-a and SDL3-b and the fourth data voltage DATA4 which is a red data voltage is applied to the plurality of fourth sub data lines SDL4-a and SDL4-b. Further, the fifth data voltage DATA5 which is a green data voltage is applied to the plurality of fifth sub data lines SDL5-a and SDL5-b and the sixth data voltage DATA6 which is a blue data voltage is applied to the plurality of sixth sub data lines SDL6-a and SDL6-b.

Each of the plurality of gate lines GL1 to GL4 may be disposed on both sides of the plurality of sub pixels R, G, B and two gate lines GL2 and GL3 may be disposed between the plurality of sub pixels R, G, B.

Specifically, referring to FIG. 12, the first gate line GL1 and the second gate line GL2 are disposed on both sides of the plurality of sub pixels R, G, B in the odd-numbered rows and the third gate line GL3 and the fourth gate line GL4 are disposed on both sides of the plurality of sub pixels R, G, B in the even-numbered rows. Therefore, the second gate line GL2 and the third gate line GL3 are disposed between the plurality of sub pixels R, G, B in the odd-numbered rows and the plurality of sub pixels R, G, B in the even-numbered rows.

In the meantime, the plurality of first sub pixels R disposed in the 12 k-11th column, the plurality of second sub pixels G disposed in the 12 k-10th column, the plurality of third sub pixels B disposed in the 12 k-6th column, the plurality of first sub pixels R disposed in the 12 k-5th column, the plurality of second sub pixels G disposed in the 12 k-1$^{st}$ column, and the plurality of third sub pixels B disposed in the 12 k-th column are connected to the odd-numbered gate lines GL1 and GL3. Further, the plurality of first sub pixels R disposed in the 12 k-8th column, the plurality of second sub pixels G disposed in the 12 k-7th column, the plurality of third sub pixels B disposed in the 12 k-9th column, the plurality of first sub pixels R disposed in the 12 k-2ndcolumn, the plurality of second sub pixels G disposed in the 12 k-4th column, and the plurality of third sub pixels B disposed in the 12 k-3rd column are connected to the even-numbered gate lines GL2 and GL4.

For example, as illustrated in FIG. 12, in the odd-numbered rows, the plurality of first sub pixels R disposed in the 12 k-11th column is connected to the first gate line GL1, and the plurality of first sub pixels R disposed in the 12 k-8th column adjacent thereto is connected to the second gate line GL2. Further, the plurality of first sub pixels R disposed in the 12 k-5th column adjacent thereto is connected to the first gate line GL1, and the plurality of first sub pixels R disposed in the 12 k-2nd column adjacent thereto is connected to the second gate line GL2. In the odd-numbered rows, the plurality of second sub pixels G disposed in the 12 k-10th column is connected to the first gate line GL1 and the plurality of second sub pixels G disposed in the 12 k-7th column adjacent thereto is connected to the second gate line GL2. Further, the plurality of second sub pixels G disposed in the 12 k-4th column adjacent thereto is connected to the second gate line GL2 and the plurality of second sub pixels G disposed in the 12 k-1st column adjacent thereto is connected to the first gate line GL1. In the odd-numbered rows, the plurality of third sub pixels B disposed in the 12 k-9th column is connected to the second gate line GL2, and the plurality of third sub pixels B disposed in the 12 k-6th column adjacent thereto is connected to the first gate line GL1. Further, the plurality of third sub pixels B disposed in the 12 k-3rd column is connected to the second gate line GL2 and the plurality of third sub pixels B disposed in the 12 k-th column adjacent thereto is connected to the first gate line GL1.

Further, as illustrated in FIG. 12, in the even-numbered rows, the plurality of first sub pixels R disposed in the 12 k-11th column is connected to the third gate line GL3, and the plurality of first sub pixels R disposed in the 12 k-8th column adjacent thereto is connected to the fourth gate line GL4. Further, the plurality of first sub pixels R disposed in the 12 k-5th column adjacent thereto is connected to the third gate line GL3, and the plurality of first sub pixels R disposed in the 12 k-2nd column adjacent thereto is connected to the fourth gate line GL4. Further, in the even-numbered rows, the plurality of second sub pixels G disposed in the 12 k-10th column is connected to the third gate line GL3, and the plurality of second sub pixels G disposed in the 12 k-7th column adjacent thereto is connected to the fourth gate line GL4. Further, the plurality of second sub pixels G disposed in the 12 k-4th column adjacent thereto is connected to the fourth gate line GL4, and the plurality of second sub pixels G disposed in the 12 k-1st column adjacent thereto is connected to the third gate line GL3. Further, in the even-numbered rows, the plurality of third sub pixels B disposed in the 12 k-9th column is connected to the fourth gate line GL4, and the plurality of third sub pixels B disposed in the 12 k-6th column adjacent thereto is connected to the third gate line GL3. Further, the plurality of third sub pixels B disposed in the 12 k-3rd column is connected to the fourth gate line GL4 and the plurality of third sub pixels B disposed in the 12 k-th column adjacent thereto is connected to the third gate line GL3.

Each of the plurality of reference voltage lines RVL1, RVL2, and RVL3 may be disposed in one pixel PX.

Specifically, a first reference voltage line RVL1 is disposed between the plurality of second sub pixels G disposed in the 12 k-10th column and the plurality of third sub pixels B disposed in the 12 k-9th column. Therefore, the plurality of first sub pixels R disposed in the 12 k-11th column, the plurality of second sub pixels G disposed in the 12 k-10th column, the plurality of third sub pixels B disposed in the 12 k-9th column, and the plurality of first sub pixels R disposed in the 12 k-8th column may be connected to the first reference voltage line RVL1.

A second reference voltage line RVL2 is disposed between the plurality of third sub pixels B disposed in the 12 k-6th column and the plurality of first sub pixels R disposed in the 12 k-5th column. Therefore, the plurality of second sub pixels G disposed in the 12 k-7th column, the plurality of third sub pixels B disposed in the 12 k-6th column, the plurality of first sub pixels R disposed in the 12 k-5th column, and the plurality of second sub pixels G disposed in the 12 k-4th column may be connected to the second reference voltage line RVL2.

A third reference voltage line RVL3 is disposed between the plurality of first sub pixels R disposed in the 12 k-2nd column and the plurality of second sub pixels G disposed in the 12 k-1st column. Therefore, the plurality of third sub pixels B disposed in the 12 k-3rd column, the plurality of first sub pixels R disposed in the 12 k-2nd column, the plurality of second sub pixels G disposed in the 12 k-1st column, and the plurality of third sub pixels B disposed in the 12 k-th column may be connected to the third reference voltage line RVL3.

Hereinafter, a sensing method of a display device 500 according to still another exemplary aspect (Example 5) of the present disclosure will be described with reference to FIG. 13.

Figure 13:
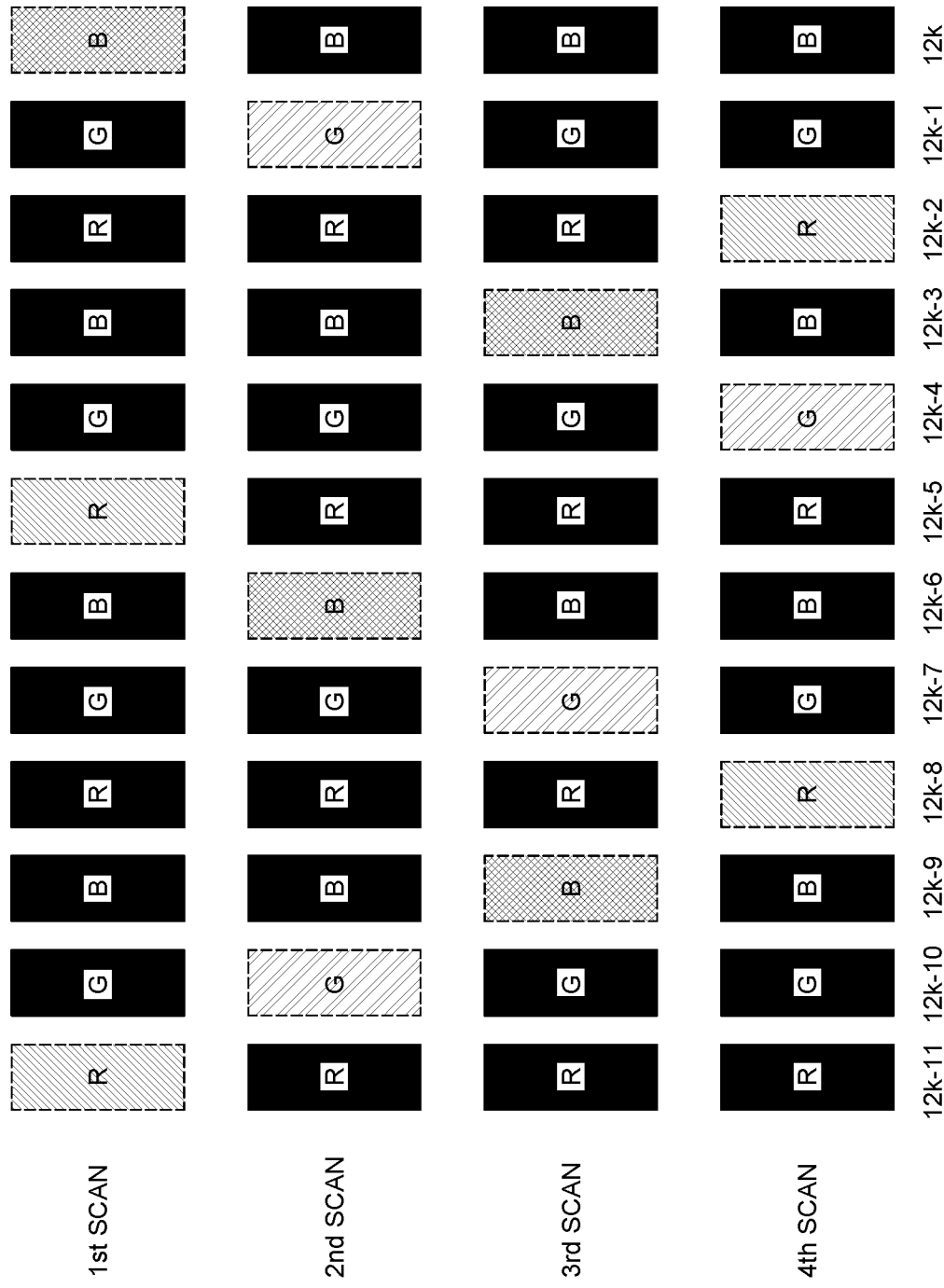
FIG. 13 is a view for explaining a sensing method of a display device according to a further exemplary aspect of the present disclosure.

FIG. 13 is a view for explaining a sensing method of a display device according to still another exemplary aspect (fifth exemplary aspect) of the present disclosure.

In FIG. 13, in the odd-numbered rows illustrated in FIG. 12, a sensing order for each of a plurality of sub pixels R, G, B disposed in the 12 k-11th column to 12 k-th column is illustrated. However, in the even-numbered rows, the sensing order for each of the plurality of sub pixels R, G, B disposed in the 12 k-11th column to 12 k-th column may be the same as the sensing order for each of the plurality of sub pixels R, G, B disposed in the 12 k-11th column to 12 k-th column in the odd-numbered rows. However, the present disclosure is not limited thereto and the sensing order for each of the plurality of sub pixels R, G, B may vary in various ways. Further, the plurality of sub pixels R, G, B disposed in the even-numbered rows and the plurality of sub pixels R, G, B disposed in the odd-numbered rows may be sensed in different time periods. However, the present disclosure is not limited thereto and the plurality of sub pixels R, G, B disposed in the even-numbered rows and the plurality of sub pixels R, G, B disposed in the odd-numbered rows may be sensed in the same time period.

FIG. 13 illustrates a state of a plurality of sub pixels disposed in one row in a first scan period 1st SCAN and a second scan period 2nd SCAN in which a gate high voltage is applied to a first gate line GL1 which is any one of odd-numbered gate lines and in one row in a third scan period 3rd SCAN and a fourth scan period 4th SCAN in which a gate high voltage is applied to a second gate line GL2 which is any one of even-numbered gate lines. The first scan period 1st SCAN, the second scan period 2nd SCAN, the third scan period 3rd SCAN, and the fourth scan period 4th SCAN refer to time periods which are sequentially connected.

Sub pixels R, G, B represented with dotted lines refer to sub pixels R, G, B in which a data voltage is applied in the corresponding scan period and the sensing is performed. The sub pixels R, G, B with a black pattern refer to sub pixels R, G, B in which a data voltage is not applied in the corresponding scan period and the sensing is not performed.

Referring to FIGS. 12 and 13, since the first gate voltage GATE1 is a gate high voltage in the first scan period 1st SCAN, in the plurality of first sub pixels R disposed in the 12 k-11th column connected to the first gate line GL1, the plurality of second sub pixel G disposed in the 12 k-10th column, the plurality of third sub pixels B disposed in the 12 k-6th column, the plurality of first sub pixels R disposed in the 12 k-5th column connected to the first gate line GL1, the plurality of second sub pixel G disposed in the 12 k-1st column, and the plurality of third sub pixels B disposed in the 12 k-th column, the switching transistor SWT and the sensing transistor SET are turned on.

During the first scan period 1st SCAN, the data voltage is applied to only any one of the plurality of first sub pixels R disposed in the 12 k-11th column and the plurality of second sub pixels G disposed in the 12 k-10th column, connected to the first gate line GL1, to be sensed by the first reference voltage line RVL1. Further, the data voltage is applied to only any one of the plurality of third sub pixels B disposed in the 12 k-6th column and the plurality of first sub pixels R disposed in the 12 k-5th column, connected to the first gate line GL1, to be sensed by the second reference voltage line RVL2. Further, the data voltage is applied to only any one of the plurality of second sub pixels G disposed in the 12 k-1st column and the plurality of third sub pixels B disposed in the 12 k-th column, connected to the first gate line GL1, to be sensed by the third reference voltage line RVL3.

For example, as illustrated in FIGS. 12 and 13, during the first scan period 1st SCAN, the data voltage is applied to the plurality of first sub pixels R disposed in the 12 k-11th column to be sensed by the first reference voltage line RVL1. Further, the data voltage is applied to the plurality of first sub pixels R disposed in the 12 k-5th column to be sensed by the second reference voltage line RVL2. Further, the data voltage is applied to the plurality of third sub pixels B disposed in the 12 k-th column to be sensed by the third reference voltage line RVL3.

Since the first gate voltage GATE1 is a gate high voltage in the subsequent second scan period 2nd SCAN, in the plurality of first sub pixels R disposed in the 12 k-11th column, the plurality of second sub pixel G disposed in the 12 k-10th column, the plurality of third sub pixels B disposed in the 12 k-6th column, the plurality of first sub pixels R disposed in the 12 k-5th column, the plurality of second sub pixel G disposed in the 12 k-1st column, and the plurality of third sub pixels B disposed in the 12 k-th column, which are connected to the first gate line GL1, the switching transistor SWT and the sensing transistor SET are turned on.

During the second scan period 2nd SCAN, the data voltage is applied to only the other one of the plurality of first sub pixels R disposed in the 12 k-11th column and the plurality of second sub pixels G disposed in the 12 k-10th column, connected to the first gate line GL1, to be sensed by the first reference voltage line RVL1. Further, the data voltage is applied to only the other one of the plurality of third sub pixels B disposed in the 12 k-6th column and the plurality of first sub pixels R disposed in the 12 k-5th column, connected to the first gate line GL1, to be sensed by the second reference voltage line RVL2. Further, the data voltage is applied to only the other one of the plurality of second sub pixels G disposed in the 12 k-1st column and the plurality of third sub pixels B disposed in the 12 k-th column, connected to the first gate line GL1, to be sensed by the third reference voltage line RVL3.

For example, as illustrated in FIGS. 12 and 13, during the second scan period 2nd SCAN, the data voltage is applied to the plurality of second sub pixels G disposed in the 12 k-10th column to be sensed by the first reference voltage line RVL1. Further, the data voltage is applied to the plurality of third sub pixels B disposed in the 12 k-6th column to be sensed by the second reference voltage line RVL2. Further, the data voltage is applied to the plurality of second sub pixels G disposed in the 12 k-1st column to be sensed by the third reference voltage line RVL3.

During the third scan period 3rd SCAN, the data voltage is applied to any one of the plurality of third sub pixels B disposed in the 12 k-9th column and the plurality of first sub pixels R disposed in the 12 k-8th column, connected to the second gate line GL2, to be sensed by the first reference voltage line RVL1. Further, the data voltage is applied to any one of the plurality of second sub pixels G disposed in the 12 k-7th column and the plurality of second sub pixels G disposed in the 12 k-4th column, connected to the second gate line GL2, to be sensed by the second reference voltage line RVL2. Further, the data voltage is applied to any one of the plurality of third sub pixels B disposed in the 12 k-3rd column and the plurality of first sub pixels R disposed in the 12 k-2nd column, connected to the second gate line GL2, to be sensed by the third reference voltage line RVL3.

For example, as illustrated in FIGS. 12 and 13, during the third scan period 3rd SCAN, the data voltage is applied to the plurality of third sub pixels B disposed in the 12 k-9th column to be sensed by the first reference voltage line RVL1. Further, the data voltage is applied to the plurality of second sub pixels G disposed in the 12 k-7th column to be sensed by the second reference voltage line RVL2. Further, the data voltage is applied to the plurality of third sub pixels B disposed in the 12 k-3rd column to be sensed by the third reference voltage line RVL3.

During the subsequent fourth scan period 4th SCAN, the data voltage is applied to the other one of the plurality of third sub pixels B disposed in the 12 k-9th column and the plurality of first sub pixels R disposed in the 12 k-8th column, connected to the second gate line GL2, to be sensed by the first reference voltage line RVL1. Further, the data voltage is applied to the other one of the plurality of second sub pixels G disposed in the 12 k-7th column and the plurality of second sub pixels G disposed in the 12 k-4th column, connected to the second gate line GL2, to be sensed by the second reference voltage line RVL2. Further, the data voltage is applied to the other one of the plurality of third sub pixels B disposed in the 12 k-3rd column and the plurality of first sub pixels R disposed in the 12 k-2nd column, connected to the second gate line GL2, to be sensed by the third reference voltage line RVL3.

For example, as illustrated in FIGS. 12 and 13, during the fourth scan period 4th SCAN, the data voltage is applied to the plurality of first sub pixels R disposed in the 12 k-8th column to be sensed by the first reference voltage line RVL1. Further, the data voltage is applied to the plurality of second sub pixels G disposed in the 12 k-4th column to be sensed by the second reference voltage line RVL2. Further, the data voltage is applied to the plurality of first sub pixels R disposed in the 12 k-2nd column to be sensed by the third reference voltage line RVL3.

As described above, during one scan period among a plurality of scan periods, sub pixels R, G, B having different colors may be sensed.

Further, in the display device of the related art, in one scan period, only one sub pixel among a plurality of sub pixels disposed in a 12 k-11th column to a 12 k-th column is sensed so that 12 scan periods are necessary to sense all the plurality of sub pixels disposed in the 12 k-11th column to 12 k-th column.

In contrast, in the display device 500 according to another exemplary aspect (fifth exemplary aspect) of the present disclosure, in one scan period, two or one sub pixel among a plurality of sub pixels R, G, B disposed in the 12 k-11th column to 12 k-th column are sensed. Therefore, only four scan periods are necessary to sense all the plurality of sub pixels R, G, B disposed in the 12 k-11th column to 12 k-th column. Accordingly, the display device 500 according to another exemplary aspect (fifth exemplary aspect) of the present disclosure may more quickly sense the plurality of sub pixels.

The exemplary aspects of the present disclosure can also be described as follows:

According to an aspect of the present disclosure, a display device includes a display panel in which a plurality of pixels including a plurality of first sub pixels, a plurality of second sub pixels, a plurality of third sub pixels, and a plurality of fourth sub pixels each having a different color may be disposed; a data driver configured to supply a data voltage to the plurality of pixels by means of a plurality of data lines using a sensing result of the plurality of pixels by a first reference voltage line and a second reference voltage line; and a gate driver configured to supply a gate signal to the plurality of pixels by means of a plurality of gate lines, the plurality of first sub pixels may be disposed in a 8 k-7th column and a 8 k-3rd column, the plurality of second sub pixels may be disposed in a 8 k-6th column and a 8 k-2nd column, the plurality of third sub pixels may be disposed in a 8 k-5th column and a 8 k-1st column, and the plurality of fourth sub pixels may be disposed in a 8 k-4th column and a 8 k-th column, each of the plurality of data lines may be divided into a plurality of sub data lines, and each of the plurality of sub data lines may be connected to a plurality of sub pixels having the same color, the first reference voltage line may be connected to the plurality of first sub pixels disposed in the 8 k-7th column, the plurality of second sub pixels disposed in the 8 k-6th column, the plurality of third sub pixels disposed in the 8 k-5th column, and the plurality of fourth sub pixels disposed in the 8 k-4th column, and the second reference voltage line may be connected to the plurality of first sub pixels disposed in the 8 k-3rd column, the plurality of second sub pixels disposed in the 8 k-2nd column, the plurality of third sub pixels disposed in the 8 k-1st column, and the plurality of fourth sub pixels disposed in the 8 k-th column, thereby reducing a sensing time of the plurality of sub pixels.

The plurality of first sub pixels disposed in the 8 k-7th column, the plurality of second sub pixels disposed in the 8 k-6th column, the plurality of third sub pixels disposed in the 8 k-1st column, and the plurality of fourth sub pixels disposed in the 8 k-th column may be connected to odd-numbered gate lines, and the plurality of third sub pixels disposed in the 8 k-5th column, the plurality of fourth sub pixels disposed in the 8 k-4th column, the plurality of first sub pixels disposed in the 8 k-3rd column, and the plurality of second sub pixels disposed in the 8 k-2nd column may be connected to even-numbered gate lines.

During a first scan period and a second scan period, a gate high voltage may be applied to any one of the odd-numbered gate lines and during a third scan period and a fourth scan period, a gate high voltage may be applied to any one of the even-numbered gate lines.

During the first scan period, any one of the plurality of first sub pixels disposed in the 8 k-7th column and the plurality of second sub pixels disposed in the 8 k-6th column may be sensed by the first reference voltage line and any one of the plurality of third sub pixels disposed in the 8 k-1st column and the plurality of fourth sub pixels disposed in the 8 k-th column may be sensed by the second reference voltage line and during the second scan period, the other one of the plurality of first sub pixels disposed in the 8 k-7th column and the plurality of second sub pixels disposed in the 8 k-6th column may be sensed by the first reference voltage line and the other one of the plurality of third sub pixels disposed in the 8 k-1st column and the plurality of fourth sub pixels disposed in the 8 k-th column may be sensed by the second reference voltage line.

During the third scan period, any one of the plurality of third sub pixels disposed in the 8 k-5th column and the plurality of fourth sub pixels disposed in the 8 k-4th column may be sensed by the first reference voltage line and any one of the plurality of first sub pixels disposed in the 8 k-3rd column and the plurality of second sub pixels disposed in the 8 k-2nd column may be sensed by the second reference voltage line, and during the fourth scan period, the other one of the plurality of third sub pixels disposed in the 8 k-5th column and the plurality of fourth sub pixels disposed in the 8 k-4th column may be sensed by the first reference voltage line and the other one of the plurality of first sub pixels disposed in the 8 k-3rd column and the plurality of second sub pixels disposed in the 8 k-2nd column may be sensed by the second reference voltage line.

Each of the first sub pixel, the second sub pixel, the third sub pixel, and the fourth sub pixel may include a switching transistor, a driving transistor, a storage capacitor, a sensing transistor, and a light emitting diode, and the sensing transistor outputs a voltage for sensing a threshold voltage and a mobility of the driving transistor to the first reference voltage line and the second reference voltage line.

According to another aspect of the present disclosure, a display device includes: a display panel in which a plurality of pixels including a plurality of first sub pixels, a plurality of second sub pixels, a plurality of third sub pixels, and a plurality of fourth sub pixels each having a different color may be disposed; a data driver configured to supply a data voltage to the plurality of pixels by means of a plurality of data lines using a sensing result of the plurality of pixels by a first reference voltage line, a second reference voltage line, and a third reference voltage line; and a gate driver configured to supply a gate signal to the plurality of pixels by means of a plurality of gate lines, the plurality of first sub pixels may be disposed in a 8 k-7th column and a 8 k-3rd column, the plurality of second sub pixels may be disposed in a 8 k-6th column and a 8 k-2nd column, the plurality of third sub pixels may be disposed in a 8 k-5th column and a 8 k-1st column, and the plurality of fourth sub pixels may be disposed in a 8 k-4th column and a 8 k-th column, each of the plurality of data lines may be divided into a plurality of sub data lines, and each of the plurality of sub data lines may be connected to a plurality of sub pixels having the same color, the first reference voltage line may be connected to a plurality of first sub pixels disposed in a 8 k-7th column and a plurality of second sub pixels disposed in a 8 k-6th column, the second reference voltage line may be connected to a plurality of third sub pixels disposed in a 8 k-5th column, a plurality of fourth sub pixels disposed in a 8 k-4th column, a plurality of first sub pixels disposed in a 8 k-3rd column, and a plurality of second sub pixels disposed in a 8 k-2nd column, and the third reference voltage line may be connected to a plurality of third sub pixels disposed in a 8 k-1st column and a plurality of fourth sub pixels disposed in a 8 k-th column, thereby more precisely sensing the plurality of sub pixels.

The plurality of first sub pixels disposed in the 8 k-7th column, the plurality of second sub pixels disposed in the 8 k-6th column, the plurality of third sub pixels disposed in the 8 k-5th column, and the plurality of fourth sub pixels disposed in the 8 k-4th column may be connected to odd-numbered gate lines and the plurality of first sub pixels disposed in the 8 k-3th column, the plurality of second sub pixels disposed in the 8 k-2nd column, the plurality of third sub pixels disposed in the 8 k-1st column, and the plurality of fourth sub pixels disposed in the 8 k-th column may be connected to even-numbered gate lines.

During a first scan period and a second scan period, a gate high voltage may be applied to any one of the odd-numbered gate lines and during a third scan period and a fourth scan period, a gate high voltage may be applied to any one of the even-numbered gate lines.

During the first scan period, any one of the plurality of first sub pixels disposed in the 8 k-7th column and the plurality of second sub pixels disposed in the 8 k-6th column may be sensed by the first reference voltage line and any one of the plurality of third sub pixels disposed in the 8 k-5th column and the plurality of fourth sub pixels disposed in the 8 k-4th column may be sensed by the second reference voltage line, and during the second scan period, the other one of the plurality of first sub pixels disposed in the 8 k-7th column and the plurality of second sub pixels disposed in the 8 k-6th column may be sensed by the first reference voltage line and the other one of the plurality of third sub pixels disposed in the 8 k-5th column and the plurality of fourth sub pixels disposed in the 8 k-4th column may be sensed by the second reference voltage line.

During the third scan period, any one of the plurality of first sub pixels disposed in the 8 k-3rd column and the plurality of second sub pixels disposed in the 8 k-2nd column may be sensed by the second reference voltage line and any one of the plurality of third sub pixels disposed in the 8 k-1st column and the plurality of fourth sub pixels disposed in the 8 k-th column may be sensed by the third reference voltage line, and during the fourth scan period, the other one of the plurality of first sub pixels disposed in the 8 k-3rd column and the plurality of second sub pixels disposed in the 8 k-2nd column may be sensed by the second reference voltage line and the other one of the plurality of third sub pixels disposed in the 8 k-1st column and the plurality of fourth sub pixels disposed in the 8 k-th column may be sensed by the third reference voltage line.

Each of the first sub pixel, the second sub pixel, the third sub pixel, and the fourth sub pixel may include a switching transistor, a driving transistor, a storage capacitor, a sensing transistor, and a light emitting diode, and the sensing transistor outputs a voltage for sensing a threshold voltage and a mobility of the driving transistor to the first reference voltage line, the second reference voltage line, and the third reference voltage line.

According to still another exemplary aspect (third exemplary aspect) of the present disclosure, a display device, comprising, a display panel in which a plurality of pixels including a plurality of first sub pixel, a plurality of second sub pixel, and a plurality of third sub pixel each having a different color is disposed, a data driver which supplies a data voltage to the plurality of pixels by means of a plurality of data lines using a sensing result of the plurality of pixels by a first reference voltage line and a second reference voltage line and a gate driver which supplies a gate signal to the plurality of pixels by means of a plurality of gate lines, and the plurality of first sub pixels is disposed in a 6 k-5th column and a 6 k-2nd column, the plurality of second sub pixels is disposed in a 6 k-4th column and a 6 k-1st column, the plurality of third sub pixels is disposed in a 6 k-3rd column and a 6 k-th column, each of the plurality of data lines is divided into a plurality of sub data lines, each of the plurality of sub data lines is connected to a plurality of sub pixels among the first sub pixels, the second sub pixels and the third sub pixels having the same color, the first reference voltage line is connected to the plurality of first sub pixels disposed in the 6 k-5th column, the plurality of second sub pixels disposed in the 6 k-4th column, and the plurality of third sub pixels disposed in the 6 k-3rd column, and the second reference voltage line is connected to the plurality of first sub pixels disposed in the 6 k-2nd column, the plurality of second sub pixels disposed in the 6 k-1st column, and the plurality of third sub pixels disposed in the 6 k-th column, (k is a natural number of 1 or larger).

The plurality of first sub pixels disposed in the 6 k-5th column, the plurality of second sub pixels disposed in the 6 k-4th column, and the plurality of third sub pixels disposed in the 6 k-3rd column may be connected to odd-numbered gate lines and the plurality of first sub pixels disposed in the 6 k-2nd column, the plurality of second sub pixels disposed in the 6 k-1st column, and the plurality of third sub pixels disposed in the 6 k-th column may be connected to even-numbered gate lines.

During a first scan period and a third scan period, a gate high voltage may be applied to any one of the odd-numbered gate lines and during a second scan period and a fourth scan period, a gate high voltage may be applied to any one of the even-numbered gate lines.

During the first scan period, any one of the plurality of first sub pixels disposed in the 6 k-5th column and the plurality of second sub pixels disposed in the 6 k-4th column may be sensed by the first reference voltage line and the plurality of third sub pixels disposed in the 6 k-th column may be sensed by the second reference voltage line and during the third scan period, the other one of the plurality of first sub pixels disposed in the 6 k-5th column and the plurality of second sub pixels disposed in the 6 k-4th column is sensed by the first reference voltage line.

During the second scan period, the plurality of third sub pixels disposed in the 6 k-3rd column may be sensed by the first reference voltage line and any one of the plurality of first sub pixels disposed in the 6 k-2nd column and the plurality of second sub pixels disposed in the 6 k-1st column may be sensed by the second reference voltage line, and during the fourth scan period, the other one of the plurality of first sub pixels disposed in the 6 k-2nd column and the plurality of second sub pixels disposed in the 6 k-1st column may be sensed by the second reference voltage line.

Each of the first sub pixels, the second sub pixels, and the third sub pixels may include a switching transistor, a driving transistor, a storage capacitor, a sensing transistor, and a light emitting diode and the sensing transistor outputs a voltage for sensing a threshold voltage and a mobility of the driving transistor to the first reference voltage line and the second reference voltage line.

According to still another exemplary aspect (fourth exemplary aspect) of the present disclosure, a display panel in which a plurality of pixels including a plurality of first sub pixel, a plurality of second sub pixel, and a plurality of third sub pixel each having a different color is disposed; a data driver which supplies a data voltage to the plurality of pixels by means of a plurality of data lines using a sensing result of the plurality of pixels by a first reference voltage line, a second reference voltage line, and a third reference voltage line and a gate driver which supplies a gate signal to the plurality of pixels by means of a plurality of gate lines.

The plurality of first sub pixels is disposed in a 6 k-5th column and a 6 k-2nd column, the plurality of second sub pixels is disposed in a 6 k-4th column and a 6 k-1st column, the plurality of third sub pixels is disposed in a 6 k-3rd column and a 6 k-th column, each of the plurality of data lines is divided into a plurality of sub data lines, each of the plurality of sub data lines is connected to a plurality of sub pixels among the first sub pixels, the second sub pixels and the third sub pixels having the same color, the first reference voltage line is connected to the plurality of first sub pixels disposed in the 6 k-5th column and the plurality of second sub pixels disposed in the 6 k-4th column, the second reference voltage line is connected to the plurality of third sub pixels disposed in the 6 k-3rd column, the plurality of first sub pixels disposed in the 6 k-2nd column, and the plurality of second sub pixels disposed in the 6 k-1st column, and the third reference voltage line is connected to the plurality of third sub pixels disposed in the 6 k-th column (k is a natural number of 1 or larger).

The plurality of first sub pixels disposed in the 6 k-5th column, the plurality of second sub pixels disposed in the 6 k-4th column, and the plurality of third sub pixels disposed in the 6 k-3rd column may be connected to odd-numbered gate lines, and the plurality of first sub pixels disposed in the 6 k-2nd column, the plurality of second sub pixels disposed in the 6 k-1st column, and the plurality of third sub pixels disposed in the 6 k-th column are connected to even-numbered gate lines.

During a first scan period and a third scan period, a gate high voltage may be applied to any one of the odd-numbered gate lines and during a second scan period and a fourth scan period, a gate high voltage is applied to any one of the even-numbered gate lines.

During the first scan period, any one of the plurality of first sub pixels disposed in the 6 k-5th column and the plurality of second sub pixels disposed in the 6 k-4th column is sensed by the first reference voltage line and the plurality of third sub pixels disposed in the 6 k-3rd column may be sensed by the second reference voltage line and during the third scan period, the other one of the plurality of first sub pixels disposed in the 6 k-5th column and the plurality of second sub pixels disposed in the 6 k-4th column may be sensed by the first reference voltage line.

During the second scan period, any one of the plurality of first sub pixels disposed in the 6 k-2nd column and the plurality of second sub pixels disposed in the 6 k-1st column may be sensed by the second reference voltage line and the plurality of third sub pixels disposed in the 6 k-th column may be sensed by the third reference voltage line and during the fourth scan period, the other one of the plurality of first sub pixels disposed in the 6 k-2nd column and the plurality of second sub pixels disposed in the 6 k-1st column may be sensed by the second reference voltage line.

Each of the first sub pixels, the second sub pixels, and the third sub pixels may include a switching transistor, a driving transistor, a storage capacitor, a sensing transistor, and a light emitting diode and the sensing transistor outputs a voltage for sensing a threshold voltage and a mobility of the driving transistor to the first reference voltage line, the second reference voltage line, and the third reference voltage line.

The first reference voltage line may be disposed in the plurality of pixels and the second reference voltage line and the third reference voltage line may be disposed between the plurality of pixels.

According to still another exemplary aspect (fourth exemplary aspect) of the present disclosure, a display device, comprising a display panel in which a plurality of pixels including a plurality of first sub pixel, a plurality of second sub pixel, and a plurality of third sub pixel each having a different color is disposed, a data driver which supplies a data voltage to the plurality of pixels by means of a plurality of data lines using a sensing result of the plurality of pixels by a first reference voltage line, a second reference voltage line, and a third reference voltage line and a gate driver which supplies a gate signal to the plurality of pixels by means of a plurality of gate lines.

The plurality of first sub pixels is disposed in a 12 k-11th column, a 12 k-8th column, a 12 k-5th column, and a 12 k-2nd column, the plurality of second sub pixels is disposed in a 12 k-10th column, a 12 k-7th column, a 12 k-4th column, and a 12 k-1st column, the plurality of third sub pixels is disposed in a 12 k-9th column, a 12 k-6th column, a 12 k-3rd column, and a 12 k-th column, each of the plurality of data lines is divided into a plurality of sub data lines, each of the plurality of sub data lines is connected to a plurality of sub pixels among the first sub pixels, the second sub pixels and the third sub pixels having the same color, the first reference voltage line is connected to the plurality of first sub pixels disposed in the 12 k-11th column, the plurality of second sub pixels disposed in the 12 k-10th column, the plurality of third sub pixels disposed in the 12 k-9th column, and the plurality of first sub pixels disposed in the 12 k-8th column, the second reference voltage line is connected to the plurality of second sub pixels disposed in the 12 k-7th column, the plurality of third sub pixels disposed in the 12 k-6th column, the plurality of first sub pixels disposed in the 12 k-5th column, and the plurality of second sub pixels disposed in the 12 k-4th column, and the third reference voltage line is connected to the plurality of third sub pixels disposed in the 12 k-3rd column, the plurality of first sub pixels disposed in the 12 k-2nd column, the plurality of second sub pixels disposed in the 12 k-1st column, and the plurality of third sub pixels disposed in the 12 k-th column (k is a natural number of 1 or larger).

The plurality of first sub pixels disposed in the 12 k-11th column, the plurality of second sub pixels disposed in the 12 k-10th column, the plurality of third sub pixels disposed in the 12 k-6th column, the plurality of first sub pixels disposed in the 12 k-5th column, the plurality of second sub pixels disposed in the 12 k-1st column, and the plurality of third sub pixels disposed in the 12 k-th column are connected to odd-numbered gate lines and the plurality of first sub pixels disposed in the 12 k-8th column, the plurality of second sub pixels disposed in the 12 k-7th column, the plurality of third sub pixels disposed in the 12 k-9th column, the plurality of first sub pixels disposed in the 12 k-2nd column, the plurality of second sub pixels disposed in the 12 k-4th column, and the plurality of third sub pixels disposed in the 12 k-3rd column are connected to even-numbered gate lines.

During a first scan period and a second scan period, a gate high voltage is applied to any one of the odd-numbered gate lines and during a third scan period and a fourth scan period, a gate high voltage is applied to any one of the even-numbered gate lines.

During the first scan period, any one of the plurality of first sub pixels disposed in the 12 k-11th column and the plurality of second sub pixels disposed in the 12 k-10th column may be sensed by the first reference voltage line, any one of the plurality of third sub pixels disposed in the 12 k-6th column and the plurality of first sub pixels disposed in the 12 k-5th column may be sensed by the second reference voltage line, and any one of the plurality of second sub pixels disposed in the 12 k-1st column and the plurality of third sub pixels disposed in the 12 k-th column may be sensed by the third reference voltage line and during the second scan period, the other one of the plurality of first sub pixels disposed in the 12 k-11th column and the plurality of second sub pixels disposed in the 12 k-10th column may be sensed by the first reference voltage line, the other one of the plurality of third sub pixels disposed in the 12 k-6th column and the plurality of first sub pixels disposed in the 12 k-5th column may be sensed by the second reference voltage line, and the other one of the plurality of second sub pixels disposed in the 12 k-1st column and the plurality of third sub pixels disposed in the 12 k-th column may be sensed by the third reference voltage line.

During the third scan period, any one of the plurality of third sub pixels disposed in the 12 k-9th column and the plurality of first sub pixels disposed in the 12 k-8th column may be sensed by the first reference voltage line, any one of the plurality of second sub pixels disposed in the 12 k-7th column and the plurality of second sub pixels disposed in the 12 k-4th column may be sensed by the second reference voltage line, and any one of the plurality of third sub pixels disposed in the 12 k-3rd column and the plurality of first sub pixels disposed in the 12 k-2nd column may be sensed by the third reference voltage line and during the fourth scan period, the other one of the plurality of third sub pixels disposed in the 12 k-9th column and the plurality of first sub pixels disposed in the 12 k-8th column may be sensed by the first reference voltage line, the other one of the plurality of second sub pixels disposed in the 12 k-7th column and the plurality of second sub pixels disposed in the 12 k-4th column may be sensed by the second reference voltage line, and the other one of third sub pixels disposed in the 12 k-3rd column and the plurality of first sub pixels disposed in the 12 k-2nd column may be sensed by the third reference voltage line.

Each of the first sub pixels, the second sub pixels, and the third sub pixels may include a switching transistor, a driving transistor, a storage capacitor, a sensing transistor, and a light emitting diode and the sensing transistor outputs a voltage for sensing a threshold voltage and a mobility of the driving transistor to the first reference voltage line, the second reference voltage line, and the third reference voltage line.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a display panel in which a plurality of pixel unit including a first pixel and a second pixel are disposed in a row;
    a data driver configured to supply a data voltage to the plurality of pixels by means of a plurality of data lines for a plurality of reference voltage lines to perform sensing on the plurality of pixels; and
    a gate driver configured to supply a gate signal to the plurality of pixels by means of a plurality of gate lines,
    wherein each of the pixels includes N sub pixels each having a different color,
    wherein each of the plurality of data lines is divided into a first sub data line and a second sub data line,
    wherein each of the sub data lines is connected to the sub pixels having the same color,
    wherein each of the plurality of reference voltage lines is connected to all the sub pixels within each of the pixels, and wherein each of the plurality of gate lines are connected to N sub pixels having a different color within each pixel unit (N is a natural number of 1 or larger),
    wherein the plurality of gate lines includes a first gate line and a second gate line in the pixel unit,
    wherein the first gate line is connected to some of the sub pixels of the first pixel,
    wherein the first gate line is connected to the other sub pixels having a different color from the sub pixel of the first pixel connected to the first gate line, among sub pixels of the second pixel,
    wherein the second gate line is connected to the rest of the sub pixels from the first pixel,
    wherein the second gate line is connected to the rest of the sub pixels from the second pixel, and
    wherein during a first scan period and a second scan period, a gate high voltage is applied to the first gate line and during a third scan period and a fourth scan period, the gate high voltage is applied to the second gate line.

2. The display device according to claim 1, wherein the plurality of reference voltage lines includes a first reference voltage line and a second reference voltage line in the pixel unit; and
    wherein the first reference voltage line is connected to all the sub pixels of the first pixel, and the second reference voltage line is connected to all the sub pixels of the second pixel.

3. The display device according to claim 1, wherein during the first scan period, one of the sub pixels of the first pixel which is connected to the first gate line is sensed by the first reference voltage line and one of the sub pixels of the second pixel which is connected to the first gate line is sensed by the second reference voltage line and
    wherein during the second scan period, the other one of the sub pixels of the first pixel which is connected to the first gate line is sensed by the first reference voltage line or the other one of the sub pixels of the second pixel which is connected to the first gate line is sensed by the second reference voltage line, wherein during the third scan period, one of the sub pixels of the first pixel which is connected to the second gate line is sensed by the first reference voltage line and one of the sub pixels of the second pixel which is connected to the second gate line is sensed by the second reference voltage line, and wherein during the fourth scan period, the other one of the sub pixels of the first pixel which is connected to the second gate line is sensed by the first reference voltage line or the other one of the sub pixels of the second pixel which is connected to the second gate line is sensed by the second reference voltage line.

4. The display device according to claim 1, wherein each of the sub pixels includes a switching transistor, a driving transistor, a storage capacitor, a sensing transistor, and a light emitting diode, and the sensing transistor outputs a voltage for sensing a threshold voltage and a mobility of the driving transistor to the first reference voltage line and the second reference voltage line.

5. A display device, comprising:
a display panel in which a plurality of pixel units including a first pixel and a second pixel are disposed in a row;
a data driver configured to supply a data voltage to the plurality of pixels by means of a plurality of data lines for a plurality of reference voltage lines to perform sensing on the plurality of pixels; and
a gate driver configured to supply a gate signal to the plurality of pixels by means of a plurality of gate lines,
wherein each of the pixels includes N sub pixels each having a different color,
wherein each of the plurality of data lines is divided into a first sub data line and a second sub data line,
wherein each of the sub data lines is connected to the sub pixels having the same color,
wherein each of the plurality of reference voltage lines is connected to all the sub pixels within each of the pixels, and wherein each of the plurality of gate lines are connected to N sub pixels having a different color within each pixel unit (N is a natural number of 1 or larger),
wherein the plurality of gate lines includes a first gate line and a second gate line in the pixel unit,
wherein the first gate line is connected to some of the sub pixels of the first pixel,
wherein the first gate line is connected to the other sub pixels having a different color from the sub pixel of the first pixel connected to the first gate line, among sub pixels of the second pixel,
wherein the second gate line is connected to the rest of the sub pixels from the first pixel,
wherein the second gate line is connected to the rest of the sub pixels from the second pixel, and
wherein during a first scan period and a third scan period, a gate high voltage is applied to the first gate line and during a second scan period and a fourth scan period, the gate high voltage is applied to the second gate line.

6. The display device according to claim 5, wherein during the first scan period, one of the sub pixels of the first pixel which is connected to the first gate line is sensed by the first reference voltage line and one of the sub pixels of the second pixel which is connected to the first gate line is sensed by the second reference voltage line and wherein during the second scan period, one of the sub pixels of the first pixel which is connected to the second gate line is sensed by the first reference voltage line and one of the sub pixels of the second pixel which is connected to the second gate line is sensed by the second reference voltage line, wherein during the third scan period, the other one of the sub pixels of the first pixel which is connected to the first gate line is sensed by the first reference voltage line or the other one of the sub pixels of the second pixel which is connected to the first gate line is sensed by the second reference voltage line, and wherein during the fourth scan period, the other one of the sub pixels of the first pixel which is connected to the second gate line is sensed by the first reference voltage line or the other one of the sub pixels of the second pixel which is connected to the second gate line is sensed by the second reference voltage line.

7. A display device, comprising:
a display panel in which a plurality of pixel units including a first pixel and a second pixel are disposed in a row;
a data driver configured to supply a data voltage to the plurality of pixels by means of a plurality of data lines for a plurality of reference voltage lines to perform sensing on the plurality of pixels; and
a gate driver configured to supply a gate signal to the plurality of pixels by means of a plurality of gate lines,
wherein the first pixel and the second pixel are arranged adjacent to each other in a row,
wherein each of the pixels includes N sub pixels each having a different color,
wherein each of the plurality of data lines is divided into a first sub data line and a second sub data line,
wherein each of the sub data lines is connected to the sub pixels having the same color,
wherein one of the plurality of reference voltage lines is disposed between the first pixel and the second pixel and another of the plurality of reference voltage lines is disposed in the first pixel,
wherein the one of the reference voltage line is connected to N sub pixels having different colors within each pixel unit, and the another of the reference voltage line is connected to N sub pixels having different colors different from the N sub pixels connected to the one of the plurality of reference voltage lines, and
wherein the reference voltage line is connected to at least one of N sub pixels included in the first pixel and at least one of N sub pixels included in the second pixel (N is a natural number of 1 or larger).

8. The display device according to claim 7, wherein the plurality of gate lines includes a first gate line and a second gate line in the pixel unit; and
wherein the first gate line is connected to all the sub pixels of the first pixel, and the second gate line is connected to all the sub pixels of the second pixel.

9. The display device according to claim 8, wherein the plurality of pixel units includes a first pixel, a second pixel, and each pixel includes a first sub pixel, a second sub pixel, and a third sub pixel disposed in a row;
wherein the plurality of reference voltage lines includes a first reference voltage line, a second reference voltage line and a third reference voltage line in the pixel unit; and
wherein the first reference voltage line is connected to the first sub pixel of the first pixel and the second sub pixel of the first pixel, and the second reference voltage line is connected to the third sub pixel of the first pixel and the first sub pixel of the second pixel and the second sub pixel of the second pixel, and the third reference voltage line is connected to the third sub pixel of the second pixel.

10. The display device according to claim 9, wherein during a first scan period and a second scan period, a gate high voltage is applied to the first gate lines and during a third scan period and a fourth scan period, the gate high voltage is applied to the second gate line.

11. The display device according to claim 10, wherein during the first scan period, one of the sub pixels of the first pixel which is connected to the first reference voltage line is sensed by the first reference voltage line and one of the sub pixels of the second pixel which is connected to the second reference voltage line is sensed by the second reference voltage line and wherein during the second scan period, the other one of the sub pixels of the first pixel which is connected to the first reference voltage line is sensed by the first reference voltage line or the other one of the sub pixels of the second pixel which is connected to the second reference voltage line is sensed by the second reference voltage line, wherein during the third scan period, one of the sub pixels of the second pixel which is connected to the second reference voltage line is sensed by the second reference voltage line and one of the sub pixels of the second pixel which is connected to the third reference voltage line is sensed by the third reference voltage line, and wherein during the fourth scan period, the other one of the sub pixels of the second pixel which is connected to the second reference voltage line is sensed by the second reference voltage line or the other one of the sub pixels of the second pixel which is connected to the third reference voltage line is sensed by the third reference voltage line.

12. The display device according to claim 9, wherein during a first scan period and a third scan period, a gate high voltage is applied to the first gate line and during a second scan period and a fourth scan period, the gate high voltage is applied to the second gate line.

13. The display device according to claim 12, wherein during the first scan period, one of the sub pixels of the first pixel which is connected to the first reference voltage line is sensed by the first reference voltage line and one of the sub pixels of the second pixel which is connected to the second reference voltage line is sensed by the second reference voltage line, and wherein during the second scan period, one of the sub pixels of the second pixel which is connected to the second reference voltage line is sensed by the second reference voltage line and one of the sub pixels of the second pixel which is connected to the third reference voltage line is sensed by the third reference voltage line, wherein during the third scan period, the other one of the sub pixels of the first pixel which is connected to the first reference voltage line is sensed by the first reference voltage line or the other one of the sub pixels of the second pixel which is connected to the second reference voltage line is sensed by the second reference voltage line, and wherein during the fourth scan period, the other one of the sub pixels of the second pixel which is connected to the second reference voltage line is sensed by the second reference voltage line or the other one of the sub pixels of the second pixel which is connected to the third reference voltage line is sensed by the third reference voltage line.

14. The display device according to claim 8, wherein the plurality of pixel units includes a first pixel, a second pixel, and each pixel includes a first sub pixel, a second sub pixel, a third sub pixel, and a fourth sub pixel disposed in a row;

wherein the plurality of reference voltage lines includes a first reference voltage line, a second reference voltage line and a third reference voltage line in the pixel unit; and wherein the first reference voltage line is connected to the first sub pixel of the first pixel and the second sub pixel of the first pixel, and the second reference voltage line is connected to the third sub pixel of the first pixel and the fourth sub pixel of the first pixel and the first sub pixel of the second pixel and the second sub pixel of the second pixel, and the third reference voltage line is connected to the third sub pixel of the second pixel and the fourth sub pixel of the second pixel.

* * * * *